US012571096B2

(12) United States Patent
Okabe et al.

(10) Patent No.: US 12,571,096 B2
(45) Date of Patent: Mar. 10, 2026

(54) RAW MATERIAL GAS SUPPLY SYSTEM AND RAW MATERIAL GAS SUPPLY METHOD

(71) Applicant: Tokyo Electron Limited, Tokyo (JP)

(72) Inventors: Tsuneyuki Okabe, Nirasaki City (JP); Shigeyuki Okura, Nirasaki City (JP); Eiichi Komori, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 381 days.

(21) Appl. No.: 17/753,602

(22) PCT Filed: Sep. 9, 2020

(86) PCT No.: PCT/JP2020/034087
§ 371 (c)(1),
(2) Date: Mar. 9, 2022

(87) PCT Pub. No.: WO2021/054216
PCT Pub. Date: Mar. 25, 2021

(65) Prior Publication Data
US 2022/0333237 A1      Oct. 20, 2022

(30) Foreign Application Priority Data

Sep. 18, 2019   (JP) ................................. 2019-169358
Sep. 2, 2020    (JP) ................................. 2020-147372

(51) Int. Cl.
*C23C 16/44*        (2006.01)
*C23C 16/448*       (2006.01)
*C23C 16/455*       (2006.01)

(52) U.S. Cl.
CPC ........ *C23C 16/448* (2013.01); *C23C 16/4405* (2013.01); *C23C 16/455* (2013.01)

(58) Field of Classification Search
CPC . C23C 16/448; C23C 16/4405; C23C 16/455; C23C 16/4481; C23C 16/45525;
(Continued)

(56) References Cited

U.S. PATENT DOCUMENTS 6,195,504 B1 *   2/2001   Horie .................... C23C 16/448
                                                        392/394
6,216,708 B1 *   4/2001   Agarwal ............. C23C 16/4405
                                                        134/1.1
(Continued)

FOREIGN PATENT DOCUMENTS

CN          103137525 A      6/2013
JP          2004115831 A     4/2004
(Continued)

*Primary Examiner* — Rudy Zervigon
(74) *Attorney, Agent, or Firm* — Armstrong Teasdale LLP

(57)               ABSTRACT

A raw material gas supply system for supplying a raw material gas generated by vaporizing a solid raw material to a processing apparatus, includes a vaporization device configured to vaporize the solid raw material to generate the raw material gas, a delivery mechanism configured to deliver a dispersion containing the solid raw material dispersed in a liquid from a storage container storing the dispersion to the vaporization device, and a separation mechanism configured to separate the solid raw material from the dispersion in the vaporization device.

11 Claims, 14 Drawing Sheets

(58) Field of Classification Search
CPC ... C23C 16/06; C23C 16/303; C23C 16/4482;
C23C 16/52; C23C 16/4408; C23C
16/4583; C23C 16/45544; B01J 4/00;
B01J 7/00; B01J 4/008; C30B 25/08;
C30B 29/403; C30B 25/14; C30B 25/165;
G01F 23/0007; G01F 23/04; B67D
7/3263; B67D 7/0238
USPC .............. 118/726, 727; 156/345.33, 345.34;
427/569, 570, 535; 216/58, 67
See application file for complete search history.

(56) References Cited

U.S. PATENT DOCUMENTS

| | | | | |
|---|---|---|---|---|
| 8,297,223 | B2 * | 10/2012 | Liu ..................... | C23C 16/4402 |
| | | | | 118/723 VE |
| 10,060,030 | B2 | 8/2018 | Woelk et al. | |
| 10,087,523 | B2 | 10/2018 | Collins et al. | |
| 11,104,993 | B2 | 8/2021 | Hodges et al. | |
| 2005/0006799 | A1 * | 1/2005 | Gregg ................. | C23C 16/4481 |
| | | | | 261/DIG. 65 |
| 2005/0072357 | A1 | 4/2005 | Shero et al. | |
| 2006/0112883 | A1 | 6/2006 | Suzuki et al. | |
| 2006/0185597 | A1 * | 8/2006 | Suzuki ................ | C23C 16/4481 |
| | | | | 118/726 |
| 2008/0191153 | A1 | 8/2008 | Marganski et al. | |
| 2008/0202426 | A1 * | 8/2008 | Suzuki ................ | C23C 16/4481 |
| | | | | 118/726 |
| 2009/0181168 | A1 * | 7/2009 | Chaubey ............. | C23C 16/4481 |
| | | | | 118/725 |
| 2011/0220152 | A1 * | 9/2011 | Kitajima ........... | H01L 21/67028 |
| | | | | 134/26 |
| 2012/0289059 | A1 | 11/2012 | Marsh et al. | |
| 2013/0333621 | A1 | 12/2013 | Ronsse et al. | |
| 2015/0145154 | A1 | 5/2015 | Chandrasekharan et al. | |
| 2017/0107617 | A1 * | 4/2017 | Gatineau ................. | C07F 17/00 |
| 2017/0298507 | A1 * | 10/2017 | Lee ................... | H01L 21/76831 |
| 2017/0335450 | A1 | 11/2017 | Collins et al. | |
| 2017/0362701 | A1 | 12/2017 | Logue et al. | |
| 2019/0161358 | A1 | 5/2019 | Sanchez et al. | |
| 2019/0161507 | A1 | 5/2019 | Sanchez et al. | |
| 2020/0328077 | A1 * | 10/2020 | Bush ....................... | B65G 53/16 |
| 2020/0362456 | A1 * | 11/2020 | Nakagawa .......... | C23C 16/4481 |
| 2021/0246553 | A1 | 8/2021 | Arteaga et al. | |
| 2022/0064786 | A1 * | 3/2022 | Itsuki .................. | C23C 16/4404 |
| 2022/0333237 | A1 | 10/2022 | Okabe et al. | |
| 2022/0341038 | A1 | 10/2022 | Okabe et al. | |
| 2022/0403512 | A1 * | 12/2022 | White ................ | C23C 16/4482 |

FOREIGN PATENT DOCUMENTS

| | | | |
|---|---|---|---|
| JP | 2005256107 | A | 9/2005 |
| JP | 2005-533179 | A | 11/2005 |
| JP | 2008-038211 | A | 2/2008 |
| JP | 2008522029 | A | 6/2008 |
| JP | 2008538158 | A | 10/2008 |
| JP | 2015110837 | A | 6/2015 |
| JP | 2016-191140 | A | 11/2016 |
| JP | 6477044 | B2 | 3/2019 |
| JP | 2019-104659 | A | 6/2019 |
| JP | 2019094537 | A | 6/2019 |
| KR | 200157376 | Y1 | 9/1999 |
| KR | 20100115347 | A | 10/2010 |
| WO | 2004007793 | A2 | 1/2004 |
| WO | 2019101653 | A1 | 5/2019 |
| WO | 2019115361 | A1 | 6/2019 |

* cited by examiner

FIG. 13

RAW MATERIAL GAS SUPPLY SYSTEM AND RAW MATERIAL GAS SUPPLY METHOD

CROSS-REFERENCE TO RELATED APPLICATIONS

The present application is a U.S. National Stage Entry of International Patent Application No. PCT/JP2020/034087, filed Sep. 9, 2020, which claims the benefit of priority to Japanese Patent Application No. 2019-169358, filed Sep. 18, 2019, and to Japanese Patent Application No. 2020-147372, filed Sep. 2, 2020, each of which is hereby incorporated herein by reference in its entirety.

TECHNICAL FIELD

The present disclosure relates to a raw material gas supply system and a raw material gas supply method.

BACKGROUND

Patent Document 1 discloses a raw material gas supply device that supplies a raw material obtained by sublimating a solid raw material in a raw material container to a consumption region together with a carrier gas.

PRIOR ART DOCUMENT

Patent Document

Patent Document 1: Japanese laid-open publication No. 2016-191140

SUMMARY

The present disclosure provides some embodiments of a technique capable of replenishing a solid raw material to a raw material gas supply system that supplies a raw material gas generated by vaporizing the solid raw material to a processing apparatus, in a form that does not adversely affect a process performed in the processing apparatus.

According to one embodiment of the present disclosure, there is provided a raw material gas supply system for supplying a raw material gas generated by vaporizing a solid raw material to a processing apparatus, including: a vaporization device configured to vaporize the solid raw material to generate the raw material gas; a delivery mechanism configured to deliver a dispersion containing the solid raw material dispersed in a liquid from a storage container storing the dispersion to the vaporization device; and a separation mechanism configured to separate the solid raw material from the dispersion in the vaporization device.

According to the present disclosure, it is possible to replenish a solid raw material to a raw material gas supply system that supplies a raw material gas generated by vaporizing the solid raw material to a processing apparatus, in a form that does not adversely affect a process performed in the processing apparatus.

BRIEF DESCRIPTION OF DRAWINGS

FIG. 13 is a diagram schematically showing a part of a raw material gas supply system according to a third embodiment.

DETAILED DESCRIPTION

Figure 1:
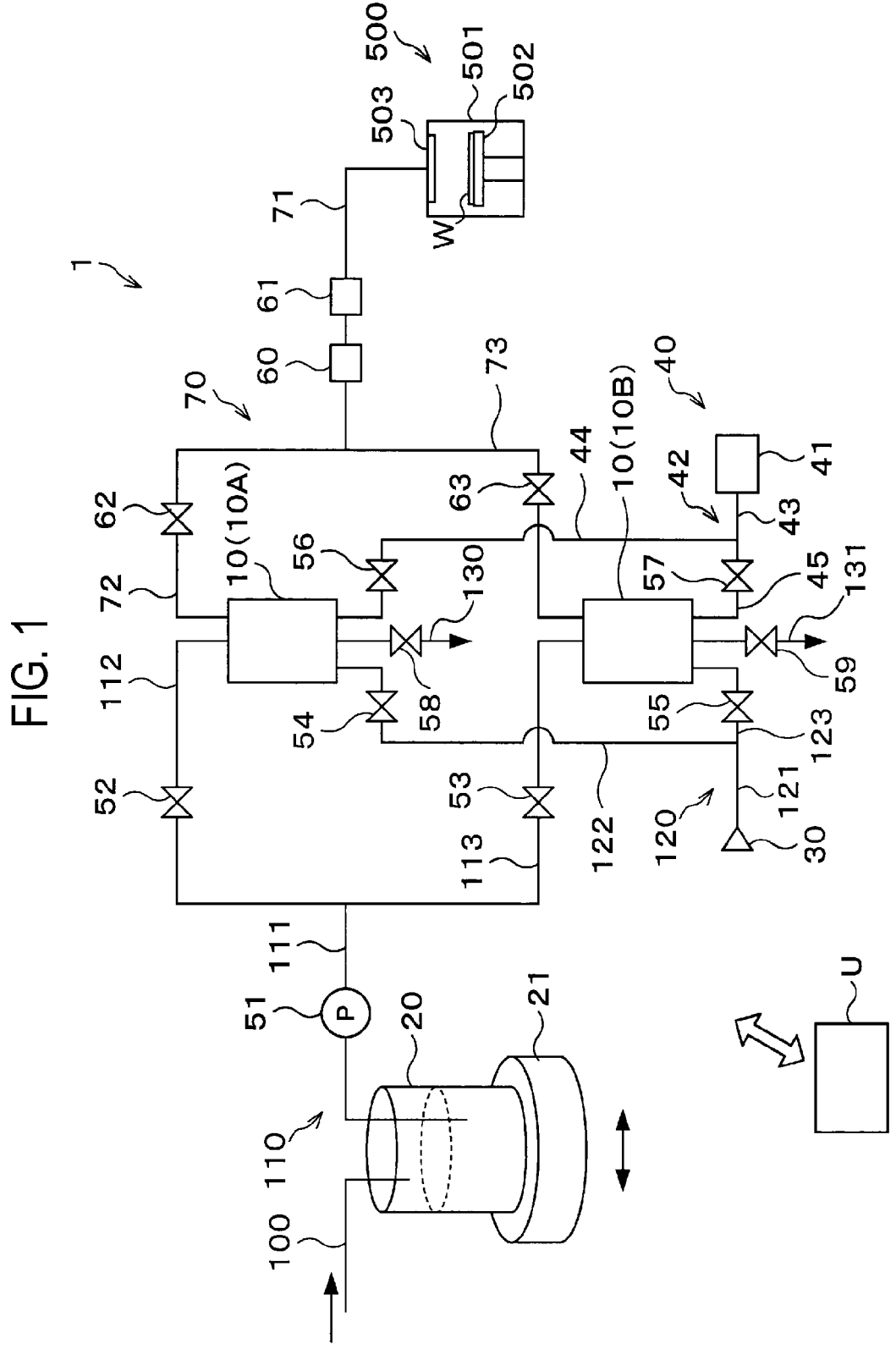
FIG. 1 is a system configuration diagram schematically showing an outline of a configuration of a raw material gas supply system according to a first embodiment.

For example, in a semiconductor device manufacturing process, various processes such as a film-forming process of forming a desired film such as a metal film or the like are repeatedly performed on a substrate such as a semiconductor wafer (hereinafter referred to as "wafer"), whereby a desired semiconductor device is manufactured on the wafer.

By the way, in the film-forming process, a solid raw material may be heated and vaporized into a raw material gas. For example, in Patent Document 1, there is disclosed a raw material gas supply device in which a solid raw material is sublimated in a raw material container, a carrier gas is discharged into the raw material container from a carrier gas introduction path, and the sublimated raw material is supplied to a film-forming part via a raw material gas flow path together with the carrier gas. In this raw material gas supply device, when a remaining amount of the solid raw material in the raw material container becomes low, the raw material is replenished by replacing the raw material container.

When the solid raw material is sublimated in the raw material container and supplied to the film-forming apparatus as described above, the raw material container is usually installed in the vicinity of the film-forming apparatus. However, in the method of replenishing the raw material to the raw material container by replacing the raw material container as described above, if the raw material container is installed in the vicinity of the film-forming apparatus, the replacement work may adversely affect the film-forming process.

Therefore, a technique according to the present disclosure can replenish the solid raw material to the raw material gas supply system that supplies the raw material gas generated by vaporizing the solid raw material to a processing apparatus, in a form that does not adversely affect the process performed in the processing apparatus.

Hereinafter, a raw material gas supply system and a raw material gas supply method according to the present embodiment will be described with reference to the drawings. In the subject specification and the drawings, elements having substantially the same functional configuration are designated by like reference numerals, and the duplicate description thereof will be omitted.

First Embodiment

FIG. 1 is a system configuration diagram schematically showing an outline of a configuration of a raw material gas supply system according to a first embodiment. A raw material gas supply system 1 of the present embodiment supplies a raw material gas to a film-forming apparatus 500 as a processing apparatus for processing a substrate.
<Film-Forming Apparatus>

As shown in FIG. 1, the film-forming apparatus 500 includes a processing container 501 configured to be depressurized, a stage 502 provided in the processing container 501 to horizontally support a wafer W as a substrate thereon, and a gas introduction part 503 configured to introduce a raw material gas or the like into the processing container 501. In this film-forming apparatus 500, for example, a tungsten (W) film is formed on a surface of the wafer W heated by a heater (not shown) of the stage 502 through an ALD (Atomic Layer Deposition) method by supplying a raw material gas from the raw material gas supply system 1. The film-forming apparatus 500 is configured so that, in addition to the raw material gas, a reaction gas (reducing gas) reacting with the raw material gas and an inert gas can be supplied from a gas source (not shown).

When the W film is formed by the film-forming apparatus 500 as described above, the raw material gas supply system 1 supplies, for example, a raw material gas generated by vaporizing a solid raw material such as tungsten chloride ($WCl_x$, e.g., $WCl_6$) or the like to the film-forming apparatus 500.
<Raw Material Gas Supply System>

The raw material gas supply system 1 includes, for example, two vaporization devices 10 (10A and 10B), a storage container 20, a carrier gas source 30, and a depressurization mechanism 40.

The vaporization devices 10 (10A and 10B) vaporize (sublimate) a solid raw material therein to generate a raw material gas. The vaporization devices 10A and 10B are connected to the film-forming apparatus 500 in parallel with each other.

In the raw material gas supply system 1, when the solid raw material is replenished to the vaporization devices 10 (10A and 10B), a dispersion in which a solid raw material is dispersed in a liquid is supplied to the vaporization devices 10 (10A and 10B).

The term "dispersion" generally refers to a system in which a gas, liquid, or solid dispersoid is dispersed in a gas, liquid, or solid dispersion medium. The dispersion includes a suspension and a colloid as subordinate concepts. The dispersion supplied to the vaporization devices 10 (10A and 10B) is a system in which a solid raw material is dispersed as a dispersoid in a solid state in a liquid dispersion medium. In the present embodiment, more specifically, the dispersion supplied to the vaporization devices 10 (10A and 10B) is a suspension in which a solid raw material is suspended in a liquid. The term "suspension" is synonymous with slurry and refers to dispersions in which solid particles are dispersed in a liquid, particularly, a dispersion in which a particle size of solid particles as a dispersoid is larger than that of sol described later so that the solid particles are precipitated when the dispersion is left as it is.

Then, in the raw material gas supply system 1, the solid raw material is separated from the suspension in which the solid raw material is used as a dispersoid in the vaporization devices 10 (10A and 10B). The vaporization devices 10 (10A and 10B) vaporize the solid raw material to generate a raw material gas.

The storage container 20 stores a suspension of a solid raw material. As the solid raw material suspended in the suspension, for example, a solid raw material having a particle size of 10 mm or less is used. Further, as the dispersion medium of the suspension, for example, one, which does not react with the solid raw material and in which the solid raw material is insoluble, is used. In the present embodiment, it is assumed that the dispersion medium of the suspension has a higher vapor pressure than the above-mentioned solid raw material. When the solid raw material is $WCl_6$, for example, ethanol, octane, toluene, or the like is used as the dispersion medium. Further, a pressurizing gas supply pipe 100 and a replenishment pipe 110 are connected to the storage container 20.

The pressurizing gas supply pipe 100 connects a supply source (not shown) of a pressurizing gas such as $N_2$ gas to the storage container 20. A liquid level of the suspension in the storage container 20 is pressed by the pressurizing gas introduced into the storage container 20 via the pressurizing gas supply pipe 100, and the suspension is supplied to the replenishment pipe 110.

The replenishment pipe 110 connects the storage container 20 and the vaporization devices 10 (10A and 10B). The replenishment pipe 110 includes a replenishment common pipe 111 having an upstream end connected to the storage container 20, and replenishment branch pipes 112 and 113 branching from a downstream end of the common pipe 111. The downstream end of the branch pipe 112 is connected to the vaporization device 10A, and the downstream end of the branch pipe 113 is connected to the vaporization device 10B. The common pipe 111 is provided with a pump 51 for delivering the suspension to the vaporization devices 10 (10A and 10B), and the branch pipes 112 and 113 are provided with on-off valves 52 and 53, respectively. In the present embodiment, the pressurizing gas supply pipe 100, the pump 51, the replenishment pipe 110, and the like constitute a delivery mechanism that delivers the suspension from the storage container 20 to the vaporization devices 10 (10A and 10B). When the suspension can be delivered from the storage container 20 to the vaporization devices 10 (10A and 10B) only by introducing the pressurizing gas from the pressurizing gas supply pipe, the pump 51 may be omitted.

Further, a stirring stage 21 as a stirring device for stirring the suspension in the storage container 20 is installed with respect to the storage container 20. The storage container 20 is placed on the stirring stage 21 which is vibrated, for example, in a horizontal direction by a vibration mechanism (not shown). When the stirring stage 21 vibrates, the storage container 20 on the stirring stage 21 also vibrates. As a result, the suspension in the storage container 20 can be stirred. A vibration direction of the stirring stage 21 is not limited to the horizontal direction, and may be, for example, a vertical direction.

The carrier gas source 30 stores a carrier gas and supplies the stored carrier gas to the vaporization devices 10 (10A and 10B). The carrier gas supplied from the carrier gas source 30 to the vaporization devices 10 (10A and 10B) is supplied to the film-forming apparatus 500 via a below-described raw material gas supply pipe together with the raw material gas generated by vaporizing the solid raw material in the vaporization devices 10 (10A and 10B). Further, a carrier gas supply pipe 120 is connected to the carrier gas source 30.

The carrier gas supply pipe 120 connects the carrier gas source 30 and the vaporization devices 10 (10A and 10B). The carrier gas supply pipe 120 includes a carrier gas common pipe 121 having an upstream end connected to the carrier gas source 30, and carrier gas branch pipes 122 and 123 that branch from a downstream end of the common pipe 121. The downstream end of the branch pipe 122 is connected to the vaporization device 10A, and the downstream end of the branch pipe 123 is connected to the vaporization device 10B. The branch pipes 122 and 123 are provided with on-off valves 54 and 55, respectively, which are carrier gas supply valves.

The depressurization mechanism 40 depressurizes the inside of the vaporization devices 10 (10A and 10B). The depressurization mechanism 40 includes an exhaust pump 41 that evacuates the inside of the vaporization devices 10 (10A and 10B), and an exhaust pipe 42 that connects the exhaust pump 41 and the vaporization devices 10 (10A and 10B). The exhaust pipe 42 includes an exhaust common pipe 43 having a downstream end connected to the exhaust pump 41, and exhaust branch pipes 44 and 45 that join at an upstream end of the common pipe 43. An upstream end of the branch pipe 44 is connected to the vaporization device 10A, and an upstream end of the branch pipe 45 is connected to the vaporization device 10B. The branch pipes 44 and 45 are provided with on-off valves 56 and 57, respectively.

Further, in the raw material gas supply system 1, discharge pipes 130 and 131 for discharging the dispersion medium of the suspension are connected to the vaporization devices 10A and 10B, respectively. The discharge pipes 130 and 131 are provided with on-off valves 58 and 59, respectively. Furthermore, in the raw material gas supply system 1, the vaporization devices 10 (10A and 10B) and the film-forming apparatus 500 are connected by a raw material gas supply pipe 70. The raw material gas supply pipe 70 includes a raw material gas common pipe 71 having a downstream end connected to the film-forming apparatus 500, and raw material gas branch pipes 72 and 73 branching from an upstream end of the common pipe 71. An upstream end of the branch pipe 72 is connected to the vaporization devices 10A, and an upstream end of the branch pipe 73 is connected to the vaporization devices 10B. The common pipe 71 is provided with a mass flow meter 60 and a flow rate control valve 61 sequentially from an upstream side, and the branch pipes 72 and 73 are provided with on-off valves 62 and 63 as raw material gas supply valves, respectively.

The raw material gas supply system 1 configured as described above is provided with a control device U. The control device U is composed of, for example, a computer equipped with a CPU, a memory, and the like, and has a program storage (not shown). The program storage also stores a program for controlling individual mechanisms, individual valves, and the like to implement a film-forming process that includes a raw material gas supply process using the raw material gas supply system 1. The program may be recorded on a storage medium readable by a computer and may be installed on the control device U from the storage medium. In addition, a part or the entirety of the program may be implemented by dedicated hardware (circuit board).

<Vaporization Device>

Figure 2:
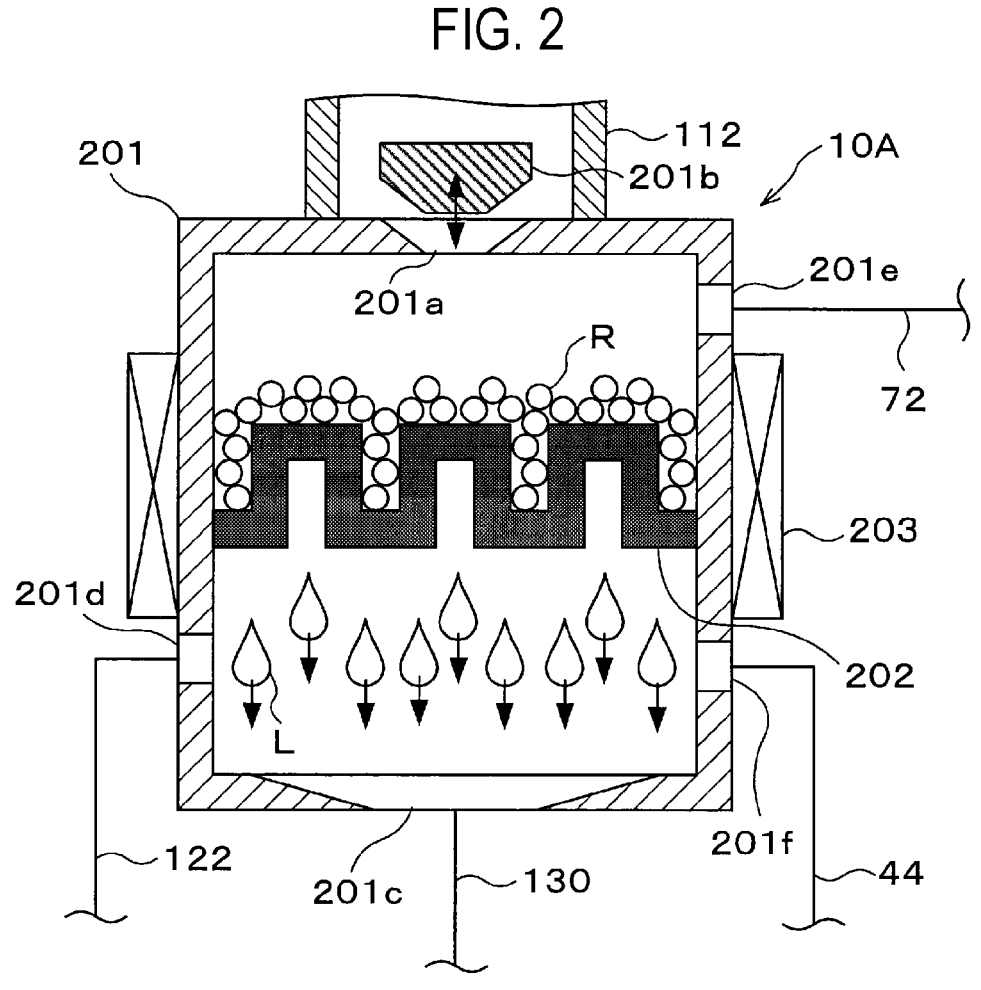
FIG. 2 is a cross-sectional view showing an outline of a configuration of a vaporization device.

Subsequently, the vaporization devices 10 (10A and 10B) will be described with reference to FIG. 2 by taking the vaporization device 10A as an example. FIG. 2 is a cross-sectional view showing an outline of a configuration of the vaporization device 10A.

As shown in FIG. 2, the vaporization device 10A includes a container 201 as a housing for accommodating the solid raw material separated from the suspension, which is sent from the storage container 20 by the delivery mechanism composed of the pump 51 or the like. The container 201 is formed in a columnar shape, for example, by a metallic material having high thermal conductivity.

At a center of a top wall of the container 201, a replenishment port 201a to which a downstream end of the replenishment branch pipe 112 is connected is formed. The suspension delivered from the storage container 20 is introduced into the vaporization device 10A, i.e., the container 201, via the replenishment port 201a. Further, a replenishment valve 201b for opening and closing the replenishment port 201a is provided for the replenishment port 201a. The replenishment valve 201b is made of a fluoro resin such as PTFE or the like.

The replenishment valve 201b closes the replenishment port 201a in such a manner that a lower portion thereof fits into the replenishment port 201a. Further, the replenishment port 201a is formed in a mortar shape with an open lower portion and has an inclined surface that extends downward and toward the center. The lower portion of the replenishment valve 201b that fits into the replenishment port 201a is formed in a shape corresponding to the mortar shape and has an inclined surface that extends downward and toward the center just like the replenishment port 201a. The inclined surface of the replenishment port 201a and the inclined surface of the lower portion of the replenishment valve 201b serve as sealing surfaces.

Further, a filter 202 having a large number of holes that are each smaller than a size of a solid raw material R in the suspension is provided inside the container 201. Specifically, the filter 202 is provided so as to extend in the horizontal direction in the container 201, and is formed to have a waveform in a sectional view. In the container 201, the filter 202 passes a dispersion medium L of the suspension sent from the storage container 20 and does not pass the solid raw material R of the suspension, thereby separating the solid raw material R from the suspension. That is, the filter 202 constitutes a separation mechanism for separating the solid raw material from the suspension in the vaporization device 10A. The solid raw material R separated by the filter 202 is deposited on the filter 202.

Further, a drainage port 201c to which an upstream end of a discharge pipe 130 is connected is connected to a center of a bottom wall of the container 201. The dispersion medium L of the suspension that has passed through the filter 202 is discharged to the outside of the container 201 via the drainage port 201c.

Furthermore, the container 201 has a carrier gas introduction port 201d to which a downstream end of the carrier gas branch pipe 122 is connected and which leads to the carrier gas source 30, and a gas supply port 201e to which an upstream end of the raw material gas branch pipe 72 is connected and which leads to the film-forming apparatus 500. The carrier gas introduction port 201d is formed on one side of the container 201 with the filter 202 sandwiched therebetween, and the gas supply port 201e is formed on the other side. In the present embodiment, the carrier gas introduction port 201d is provided at a lower portion of the side wall of the container 201 on one side in the horizontal direction, while the gas supply port 201e is provided at an upper portion of the side wall of the container 201 on the other side in the horizontal direction. That is, in the present embodiment, the carrier gas introduction port 201d and the gas supply port 201e are provided at diagonal positions in the container 201.

With the above configuration, the carrier gas introduced into the container 201 through the branch pipe 122 and the carrier gas introduction port 201d passes through the filter 202 and further passes between the solid raw materials R. Thereafter, the carrier gas is supplied to the film-forming apparatus 500 via the gas supply port 201e and the branch pipe 72 together with the raw material gas generated by vaporizing the solid raw material R.

Further, an exhaust port 201f to which an upstream end of the exhaust branch pipe 44 is connected is connected to the container 201. The inside of the container 201 is evacuated through the exhaust port 201f. The evacuation of the inside of the container 201 is performed when evaporating the dispersion medium of the suspension remaining in the container 201.

A heating mechanism 203 such as a jacket heater or the like is provided around a side wall of the container 201. The heating mechanism 203 heats the container 201 and promotes the vaporization of the solid raw material R in the container 201.

Although detailed description is omitted, a configuration of the vaporization device 10B is the same as that of the vaporization device 10A. Hereinafter, a container, a filter, a replenishment valve, and a heating mechanism of the vaporization device 10B may be described as the container 201, the filter 202, the replenishment valve 201b, and the heating mechanism 203, respectively, as in the case of the vaporization device 10A.

<Film-Forming Process>

Next, an example of the film-forming process that includes the raw material gas supply process using the raw material gas supply system 1 will be described with reference to FIGS. 3 to 6. In FIGS. 3 to 6, valves in an open state are painted in white, valves in a closed state are painted in black, and pipes through which the suspension, the carrier gas, or the raw material gas flow are indicated by thick lines. The description of the opened/closed states of other valves are omitted. Further, in the following description, it is assumed that at the start of the process, the vaporization device 10B does not need to be replenished with the solid raw material and the vaporization device 10A needs to be replenished with the solid raw material.

(Film Formation Using Raw Material Gas from Vaporization Device 10B)

Figure 3:
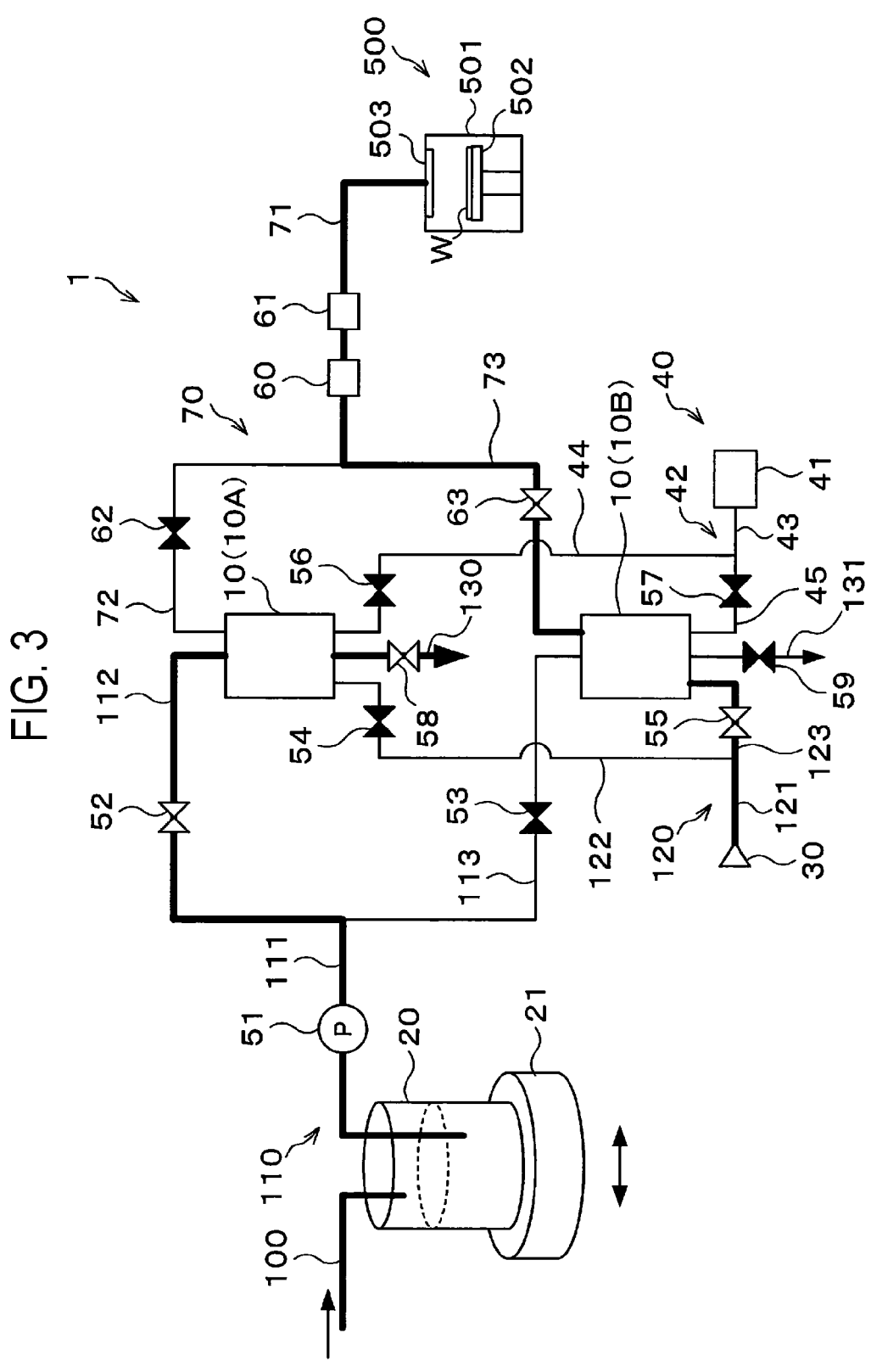
FIG. 3 is an explanatory diagram of one step of a film-forming process that includes a raw material gas supply process using the raw material gas supply system.

First, in a state in which the replenishment valve 201b (see FIG. 2) of the vaporization device 10B is closed and the vaporization device 10B is heated by the heating mechanism 203, as shown in FIG. 3, the on-off valve 55 of the carrier gas branch pipe 123 and the on-off valve 63 of the raw material gas branch pipe 73 are opened. As a result, the solid raw material R in the container 201 of the vaporization device 10B communicating with the film-forming apparatus 500 and kept in a depressurized state is vaporized to generate a raw material gas. The raw material gas is supplied to the film-forming apparatus 500 via the branch pipe 73 while the inside of the container 201 is pressurized by the carrier gas. At this time, the on-off valve 53 of the replenishment branch pipe 113, the on-off valve 59 of the discharge pipe 131, and the on-off valve 57 of the exhaust branch pipe 45 are closed.

When the raw material gas is supplied to the film-forming apparatus 500, the raw material is adsorbed on the surface of the wafer W heated by the heater (not shown) of the stage 502. Then, after a predetermined time has elapsed, the on-off valve 63 of the raw material gas branch pipe 73 is closed, and the supply of the raw material gas to the film-forming apparatus 500 is stopped. Next, an inert gas as a replacement gas is supplied to the film-forming apparatus 500 from a gas source (not shown). After the gas in the processing container 501 is replaced, a reaction gas such as $H_2$ gas or the like is supplied to the film-forming apparatus 500 from a gas source (not shown). As a result, the raw material adsorbed on the wafer W is reduced to form, for example, a tungsten film having a single atomic layer.

Subsequently, after the supply of the reaction gas is stopped, the replacement gas is supplied to the film-forming apparatus 500 from the gas source (not shown) to replace the gas in the processing container 501. Thereafter, the on-off valve 63 of the raw material gas branch pipe 73 is opened, and the supply of the raw material gas is restarted. By repeating the supply of the raw material gas, the supply of the replacement gas, the supply of the reaction gas, and the supply of the replacement gas a plurality of times as described above, a desired film having a desired thickness is formed on the wafer W.

(Replenishment of Solid Raw Material to Vaporization Device 10A)

In parallel with the film formation using the raw material gas supplied from the vaporization device 10B as described above, the solid raw material is replenished to the vaporization device 10A. In other words, when the raw material gas can be supplied from the vaporization device 10B to the film-forming apparatus 500, the suspension is delivered from the storage container 20 to the vaporization device 10A, and the solid raw material is separated from the suspension in the vaporization device 10A.

Specifically, first, in a state in which the on-off valve 53 of the replenishment branch pipe 113 is closed and the on-off valve 52 of the branch pipe 112 is opened, the replenishment valve 201b of the vaporization device 10A and the on-off valve 58 of the discharge pipe 130 are opened. Then, a pressurizing gas is introduced into the storage container 20 via the pressurizing gas supply pipe 100, and the pump 51 is driven. As a result, the suspension in the storage container 20 is supplied to the vaporization device 10A via the replenishment common pipe 111 and the branch pipe 112. The solid raw material R is filtered out and separated by the filter 202 from the suspension supplied to the vaporization device 10A and is deposited on the filter 202. Further, the dispersion medium L that has passed through the filter 202 is discharged through the discharge pipe 130. At this time, the on-off valve 54 of the carrier gas branch pipe 122 and the on-off valve 56 of the exhaust branch pipe 44 are closed.

At the timing when a desired amount of the solid raw material R is deposited on the filter 202 of the vaporization device 10A, the introduction of the pressurizing gas and the driving of the pump 51 are stopped. Specifically, the above timing is, for example, a timing at which a predetermined time has elapsed after the introduction of the pressurizing gas into the storage container 20 and the start of the driving of the pump 51.

Figure 4:
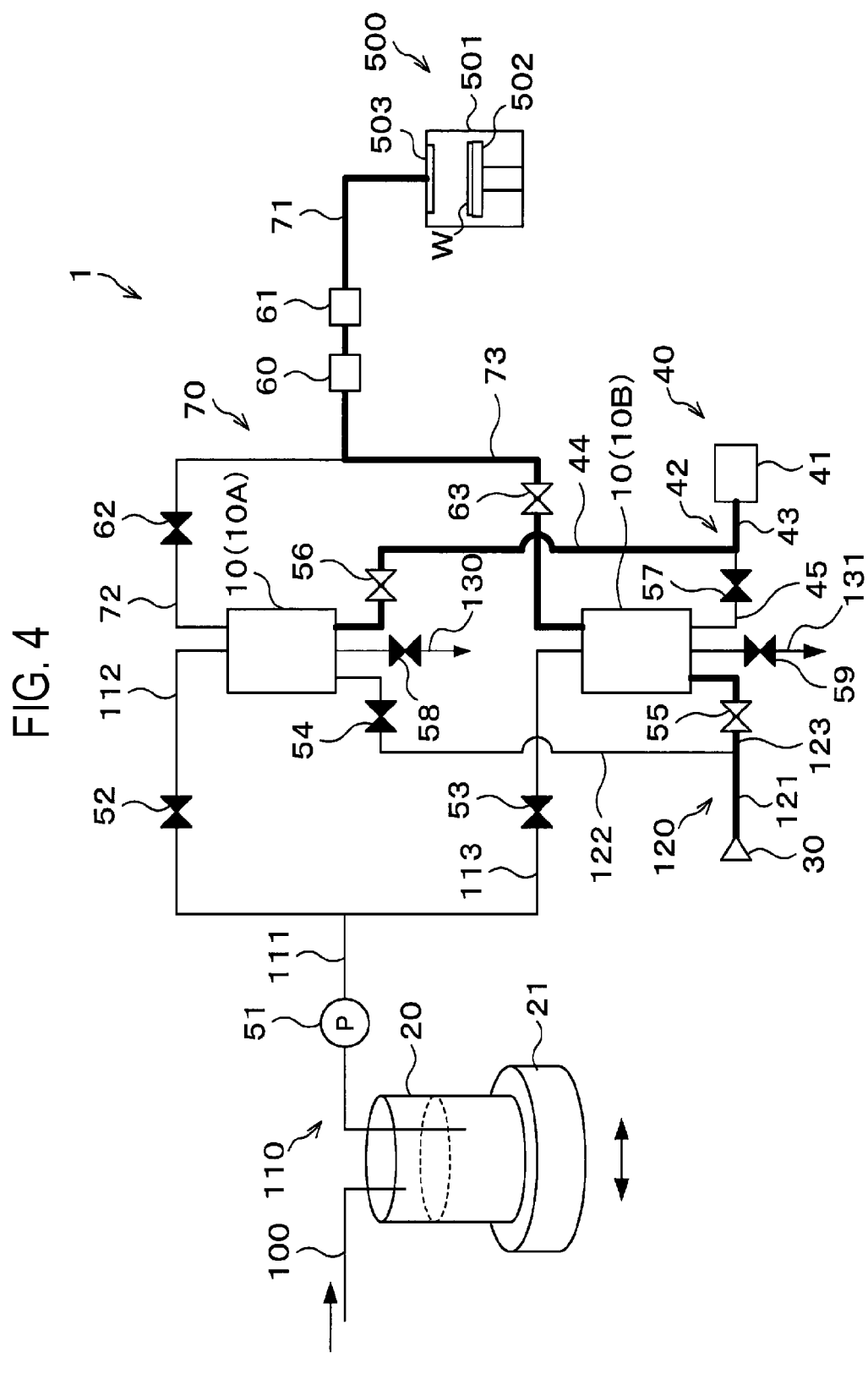
FIG. 4 is an explanatory diagram of another step of the film-forming process that includes the raw material gas supply process using the raw material gas supply system.

Thereafter, the dispersion medium of the suspension in the container 201 of the vaporization device 10A is evaporated. Specifically, for example, as shown in FIG. 4, the on-off valve 52 of the replenishment branch pipe 112, the replenishment valve 201*b* (see FIG. 2) of the vaporization device 10A, and the on-off valve 58 of the discharge pipe 130 are closed, and the on-off valve 56 of the exhaust branch pipe 44 is opened. In this state, the exhaust pump 41 is driven and the inside of the container 201 of the vaporization device 10A is depressurized, so that the dispersion medium of the suspension in the container 201 evaporates. Upon evaporation of the dispersion medium, the pressure in the container 201 is adjusted to be lower than the vapor pressure of the dispersion medium and higher than the vapor pressure of the solid raw material. At the timing when the evaporation of the dispersion medium is completed, specifically, at the timing when a predetermined time has elapsed after the on-off valve 56 of the exhaust branch pipe 44 is opened, the on-off valve 56 is closed. This completes the replenishment of the solid raw material to the vaporization device 10A. The step of evaporating the dispersion medium may be omitted.

(Switching of Raw Material Gas Source)

When a predetermined time has elapsed from the start of film formation using the raw material gas supplied from the vaporization device 10B, specifically, when film formation has been performed on a preset number of wafers W, the amount of the solid raw material R in the vaporization device 10B is reduced. Therefore, the supply source of the raw material gas is switched to the vaporization device 10A.

Figure 5:
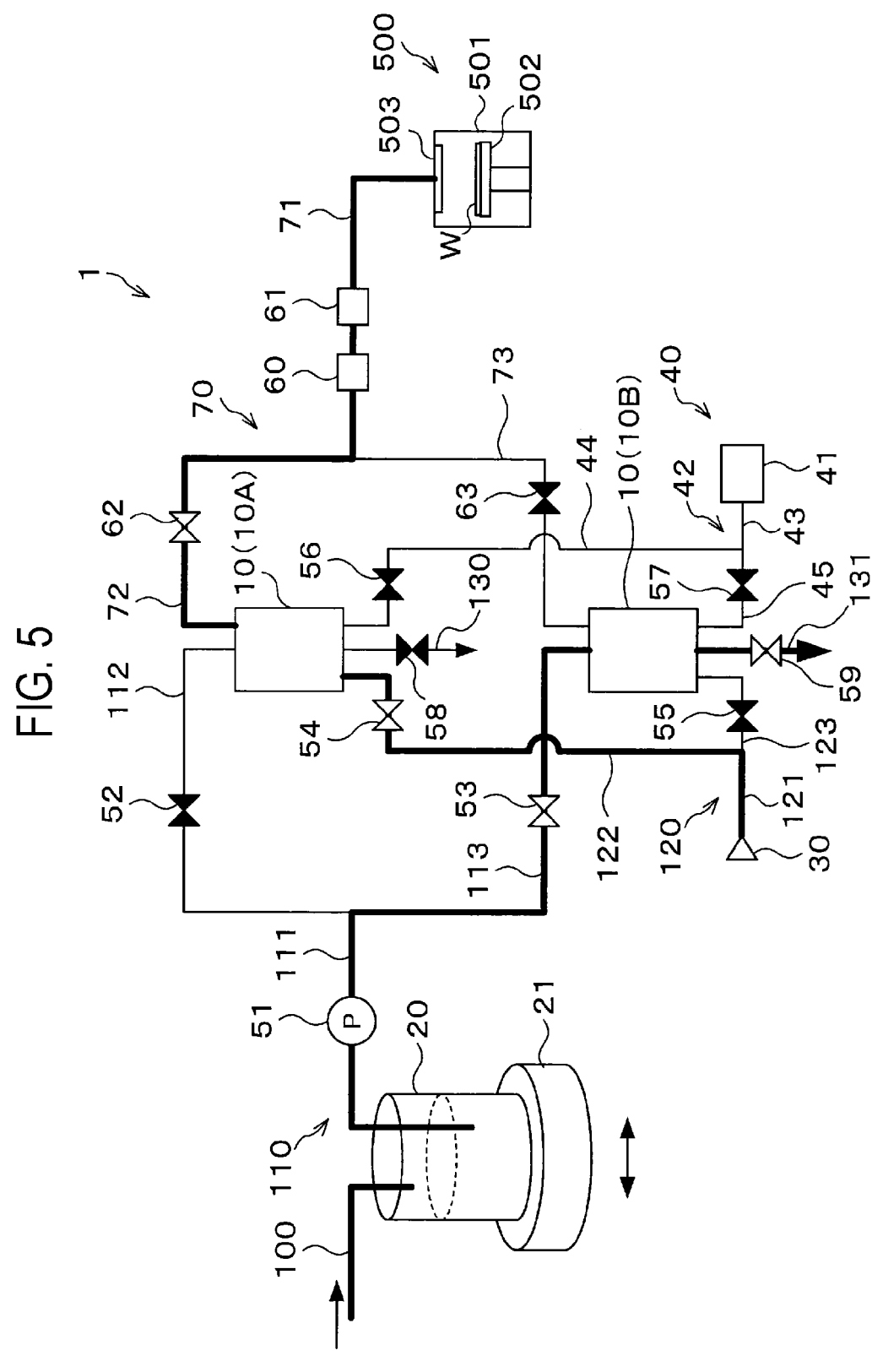
FIG. 5 is an explanatory diagram of another step of the film-forming process that includes the raw material gas supply process using the raw material gas supply system.

Specifically, first, as shown in FIG. 5, the on-off valve 63 of the raw material gas branch pipe 73 and the on-off valve 55 of the carrier gas branch pipe 123, which are connected to the vaporization device 10B, are closed. Then, in a state in which the replenishment valve 201*b* of the vaporization device 10A is closed and the vaporization device 10A is heated by the heating mechanism 203, the on-off valve 54 of the carrier gas branch pipe 122 and the on-off valve 62 of the raw material gas branch pipe 72 are opened. As a result, the solid raw material R in the container 201 of the vaporization device 10A communicating with the film-forming apparatus 500 and kept in a depressurized state is vaporized to generate a raw material gas. The raw material gas is supplied to the film-forming apparatus 500 via the branch pipe 72 while the inside of the container 201 is pressurized by the carrier gas. Then, by repeating the supply of the raw material gas, the supply of the replacement gas, the supply of the reaction gas, and the supply of the replacement gas a plurality of times in the same manner as described above, a desired film having a desired thickness is formed on the wafer W.

(Replenishment of Solid Raw Material to Vaporization Device 10B)

In parallel with the film formation using the raw material gas supplied from the vaporization device 10A as described above, the solid raw material is replenished to the vaporization device 10B. In other words, when the raw material gas can be supplied from the vaporization device 10A to the film-forming apparatus 500, the suspension is delivered from the storage container 20 to the vaporization device 10B, and the solid raw material is separated from the suspension in the vaporization device 10B.

Specifically, first, in a state in which the on-off valve 52 of the replenishment branch pipe 112 is closed and the on-off valve 53 of the branch pipe 113 is opened, the replenishment valve 201*b* of the vaporization device 10B and the on-off valve 59 of the discharge pipe 131 are opened. Then, a pressurizing gas is introduced into the storage container 20 via the pressurizing gas supply pipe 100, and the pump 51 is driven. As a result, the suspension in the storage container 20 is supplied to the vaporization device 10B via the replenishment common pipe 111 and the branch pipe 113. The solid raw material R is filtered out and separated by the filter 202 from the suspension supplied to the vaporization device 10B and is deposited on the filter 202. Further, the dispersion medium L that has passed through the filter 202 is discharged through the discharge pipe 131. At the timing when the desired amount of the solid raw material R is deposited on the filter 202 of the vaporization device 10B, the introduction of the pressurizing gas into the storage container 20 and the driving of the pump 51 are stopped.

Figure 6:
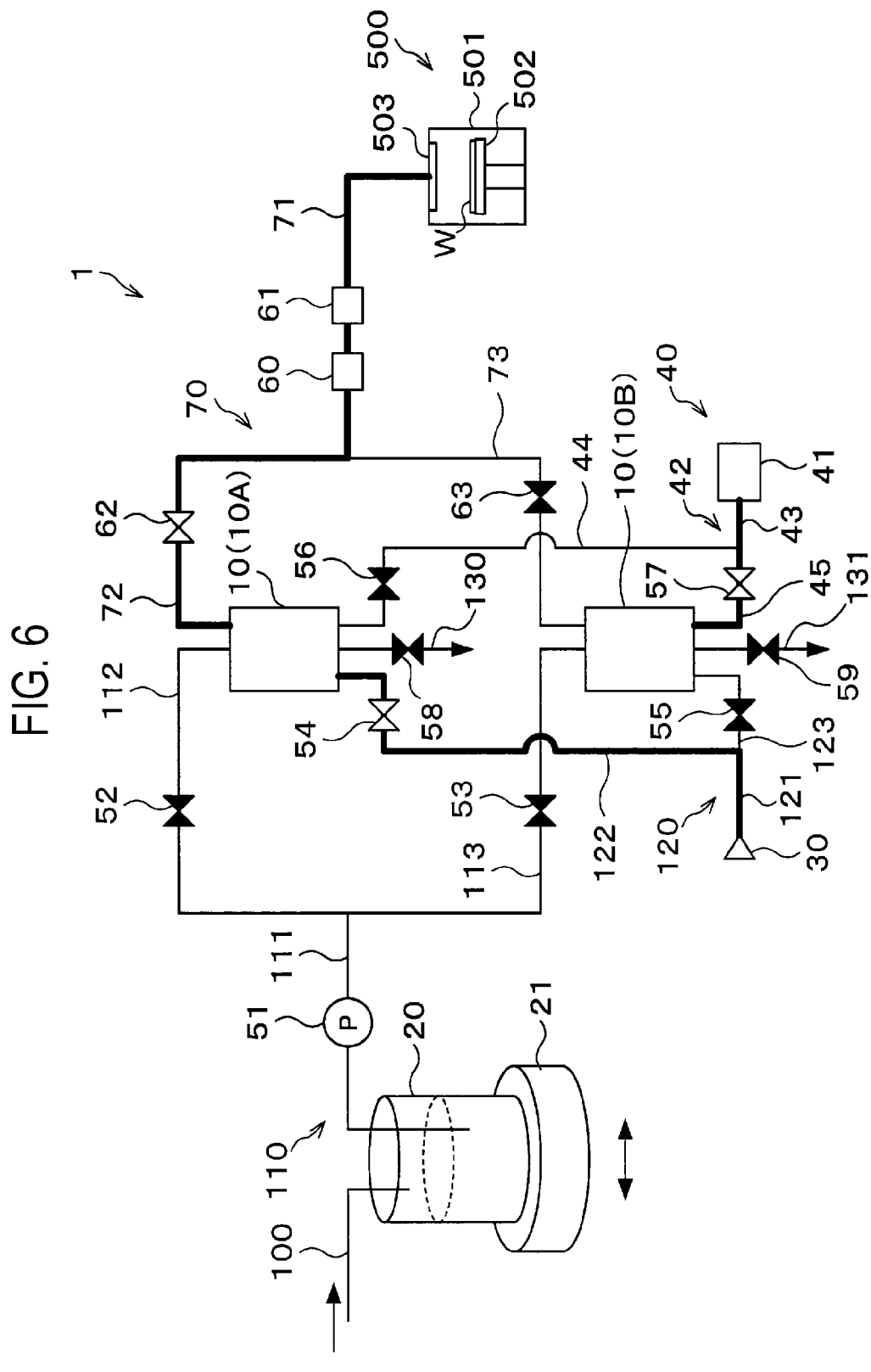
FIG. 6 is an explanatory diagram of another step of the film-forming process that includes the raw material gas supply process using the raw material gas supply system.

Thereafter, the dispersion medium of the suspension in the container 201 of the vaporization device 10B is evaporated. Specifically, for example, as shown in FIG. 6, the on-off valve 52 of the replenishment branch pipe 112, the replenishment valve 201*b* (see FIG. 2) of the vaporization device 10B, and the on-off valve 58 of the discharge pipe 130 are closed, and the on-off valve 57 of the exhaust branch pipe 45 is opened. In this state, the exhaust pump 41 is driven and the inside of the container 201 of the vaporization device 10B is depressurized, so that the dispersion medium of the suspension in the container 201 evaporates. The on-off valve 57 of the exhaust branch pipe 45 is closed at the timing when the evaporation of the dispersion medium is completed. This completes the replenishment of the solid raw material to the vaporization device 10B. The step of evaporating the dispersion medium may be omitted.

At least when the suspension is supplied to the vaporization devices 10A and 10B, the suspension in the storage container 20 is stirred by the stirring stage 21. Further, when the suspension is supplied to the vaporization device 10A, the heating of the vaporization device 10A by the heating mechanism 203 is stopped. The same applies to the vaporization device 10B. From the viewpoint of improving the operating rate, preheating may be performed by heating the container 201 to a predetermined temperature (e.g., 120 to 130 degrees C., which is lower than the sublimation temperature of $WCl_6$) by the heating mechanism 203 during a period from the replenishment of the solid raw material to the vaporization device 10A to the start of supply of the gas from the vaporization device 10A. The same applies to the vaporization device 10B.

When the amount of the raw material gas in the gas supplied from the vaporization device 10A or 10B to the film-forming apparatus 500 (hereinafter referred to as "pickup amount") decreases, the non-vaporized solid raw material R in the vaporization device 10A or 10B may be discharged. Examples of a method of discharging the solid raw material R includes the following methods (A) and (B).

(A) A method in which the solid raw material R is vaporized by performing at least one of the heating the solid raw material R by the heating mechanism 203 and the depressurization of the inside of the container 201 by the depressurization mechanism 40 and is exhausted via the film-forming apparatus 500 or the depressurization mechanism 40.

(B) A method in which the solid raw material R is melted by the heating mechanism 203 and is discharged through the discharge pipes 130 or 131.

As described above, in the raw material gas supply system 1 according to the present embodiment, when replenishing the solid raw material R to the vaporization devices 10 (10A and 10B), the solid raw material R is delivered by the delivery mechanism from the storage container 10 that stores the suspension in which the solid raw material R is suspended in the liquid. Then, the solid raw material R is separated from the suspension in the vaporization devices 10 (10A and 10B) by the separation mechanism composed of the filter 202 or the like. Therefore, according to the present embodiment, even if the vaporization devices 10 (10A and 10B) are installed in the vicinity of the film-forming apparatus 500, when replenishing the solid raw material to the vaporization devices 10 (10A and 10B), it is not necessary to perform a replenishment work in the vicinity of the film-forming apparatus 500. Therefore, the solid raw material R can be replenished to the vaporization devices 10 (10A and 10B) in a form that does not adversely affect the film-forming process performed by the film-forming apparatus 500.

Further, according to the present embodiment, the storage container 20 to be replaced does not serve as a vaporization device and the degree of freedom of installation location of the storage container 20 is high. Therefore, the storage container 20 can be installed at a position that facilitates the replacement work thereof.

Unlike a gaseous raw material or a liquid raw material, the solid raw material cannot be expected to transfer heat by convection. Therefore, it takes a long time to heat the solid raw material itself. On the other hand, according to the configuration in which as in the present embodiment, the suspension in which the solid raw material R is suspended is supplied by the delivery mechanism to replenish the solid raw material R, it is possible to adopt a configuration in which the solid raw material R is alternately replenished to two vaporization devices 10 (10A and 10B). In the configuration in which the solid raw material R is alternately replenished, while supplying the raw material gas from one vaporization device, the solid raw material R can be replenished to and heated by the other vaporization device. Therefore, even when the solid raw material R that requires a long time for heating is used, it is possible to prevent the throughput of the film-forming process from being lowered due to the waiting time until the solid raw material R is heated to a desired temperature.

As a raw material gas supply method different from the present embodiment, a method is conceivable in which a liquid raw material obtained by dissolving a solid raw material in a solvent is supplied to a vaporization device and is vaporized by the vaporization device to generate and supply a raw material gas. In this method, the liquid raw material contains carbon as a solvent. Therefore, quality of a film formed by the raw material gas may deteriorate. On the other hand, in the raw material gas supply method according to the present embodiment, the raw material gas is generated after the dispersion medium and the solid raw material are separated from each other. Therefore, it is possible to form a high-quality film.

Further, when the liquid raw material obtained by dissolving the solid raw material in the solvent is directly vaporized, the solvent needs to have substantially the same vapor pressure as the solid raw material, and the type of the solvent is limited. On the other hand, when the solid raw material is separated from the suspension and then vaporized as in the present embodiment, the type of the dispersion medium is not limited because it is only necessary for the dispersion medium to have a higher vapor pressure than the solid raw material.

Further, as a method of replenishing the solid raw material different from the present embodiment, a method is conceivable in which a solid raw material is supplied to a vaporization device in the form of a solution in which the solid raw material is dissolved in a solvent, and only the solvent is evaporated in the vaporization device to precipitate a solid raw material and replenish it to the vaporization device. As compared with this method, in the replenishment method according to the present embodiment, the solid raw material does not deteriorate at the stage of supplying it to the vaporization device. Therefore, it is possible to form a higher quality film.

Further, in the present embodiment, the filter 202 that separates the solid raw material R from the suspension is formed to have a waveform in a sectional view. Therefore, the carrier gas passing through the filter 202 makes contact over a large area with the solid raw material R separated by the filter 202 and deposited on the filter 202. Therefore, a high pickup amount can be obtained even if the solid raw material R is small.

Further, in the present embodiment, the carrier gas introduction port 201d is provided on one side of the container 201 with the filter 202 sandwiched therebetween, and the gas supply port 201e is provided on the other side. Therefore, the carrier gas reaches the gas supply port 201e through a space between the solid raw materials R deposited on the filter 202, which makes it possible to surely obtain a high pickup amount.

Furthermore, in the present embodiment, the stirring stage 21 for stirring the suspension in the storage container 20 is provided. Therefore, a ratio of the solid raw material R in the suspension supplied to the vaporization device 10 (10A and 10B) can be made uniform.

The stirring mechanism is not limited to the above example, and may be composed of, for example, a rotating body provided in the storage container 20 and a driving source for rotating the rotating body. In this case, the driving source may be provided inside the storage container 20 or may be provided outside the storage container 20. Further, the mechanism for stirring the suspension may be provided not only for the storage container 20 but also for the replenishment pipe 110 and the like. Instead of the mechanisms for stirring the suspension as described above, the suspension may be continuously circulated through a circulation path, and when it is necessary to replenish the solid raw material, the suspension may be supplied from the circulation path to the vaporization device 10 (10A or 10B) to be replenished.

Further, in the present embodiment, the raw material gas supply system 1 includes two vaporization devices 10A and 10B connected in parallel to each other. Then, when one of the vaporization devices 10A and 10B is in a state capable of supplying the raw material gas to the film-forming apparatus 500, the suspension is delivered from the storage container 20 to the other of the vaporization devices 10A and 10B to replenish the solid raw material R. Therefore, it is not necessary to stop the raw material gas supply system 1 when replenishing the solid raw material. This makes it possible to continuously supply the raw material gas. Accordingly, the throughput of the film-forming process can be improved.

Further, unlike the present embodiment, when there is one vaporization device serving as a raw material container and a raw material is replenished by replacing the vaporization device, i.e., the raw material container, the following may be performed to shorten a time period during which the raw material gas supply system is stopped at the time of replenishment and to prevent a decrease in throughput. That is, the raw material container may be enlarged and a large amount of solid raw material may be filled in the container. However, if a large amount of a very expensive solid raw material such as $WCl_6$ or the like is filled in one container to be replaced, a large loss may be incurred when a problem occurs in the container due to an accident or the like during the replacement work. Therefore, it is difficult for semiconductor manufacturers to adopt a method of filling a replacement target container with a large amount of solid raw material to prevent a decrease in the throughput of a film-forming process. On the other hand, in the present embodiment, the throughput of the film-forming process can be improved even if the replacement target container, i.e., the storage container 20, is not filled in a large amount. Therefore, the solid raw material replenishment method according to the present embodiment can be easily adopted by semiconductor manufacturers.

Further, in the present embodiment, the replenishment valve 201*b*, which cuts off communication between the replenishment pipe 110 and the vaporization devices 10 (10A and 10B) when the raw material gas is supplied from the vaporization devices 10 (10A and 10B), is provided in each of the vaporization devices 10 (10A and 10B). Therefore, it is possible to prevent unnecessary gas components from being mixed into the raw material gas.

Further, in the foregoing description, the start and stop of the supply of the raw material gas from the vaporization device 10A to the film-forming apparatus 500 is switched by using the on-off valve 62 provided in the raw material gas branch pipe 72. Alternatively, when a switching valve is provided on a downstream side of the flow rate control valve 61 in the raw material gas common pipe 71 and the raw material gas from the vaporization device 10A is used, the on-off valve 62 of the branch pipe 72 may always be kept in an open state, and the start and stop of the supply of the raw material gas may be switched by the switching valve of the common pipe 71. The same applies to the supply of the raw material gas from the vaporization device 10B.

Other Example 1 of Vaporization Device

Figure 7:
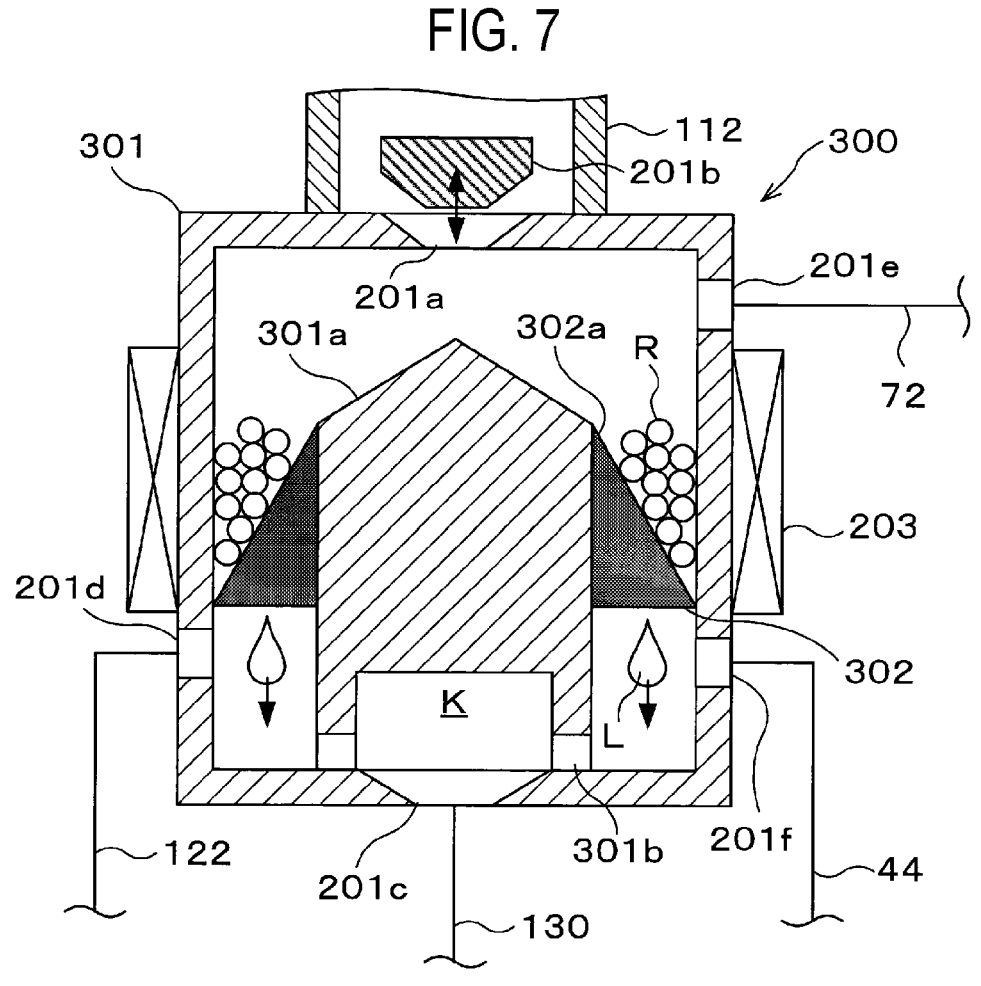
FIG. 7 is a diagram showing another example of the vaporization device.

FIG. 7 is a diagram showing another example of the vaporization device. A vaporization device 300 shown in FIG. 7 has a protrusion 301*a* formed at a central portion of a container 301 so as to protrude upward from a bottom wall. A top portion of the protrusion 301*a* is formed in a weight shape, and an upper surface thereof is composed of an inclined surface that extends downward and radially outward. Further, a space K communicating with the drainage port 201*c* is formed inside a lower portion of the protrusion 301*a*, and a hole 301*b* communicating with the space K from the outside of the protrusion 301*a* is formed on a lower lateral side of the protrusion 301*a*.

In the vaporization device 300, a filter 302 is provided between an inner peripheral surface of a side wall of the container 301 and an outer peripheral surface of the protrusion 301*a* to extend along the inner peripheral surface of the side wall. The upper surface of the filter 302 is an inclined surface 302*a* that extends downward and radially outward. Therefore, the solid raw material R in the suspension blocked by the filter 302 moves outward and downward along the inclined surface 302*a* of the filter 302. Accordingly, most of the solid raw material R in the suspension is deposited on the filter 302 at a position in the vicinity of the side wall of the container 301 heated by the heating mechanism 203. Thus, the solid raw material R deposited on the filter 302 can be efficiently vaporized by the heating mechanism 203.

An apex of the weight-shaped top portion of the protrusion 301*a* of the container 301 is provided at a position facing the replenishment port 201*a*, and the filter 302 is located below the weight-shaped top portion of the protrusion 301*a*. Therefore, the solid raw material R in the suspension supplied into the container 301 through the replenishment port 201*a* can be moved to the lateral side of the container without leaving it at the center of the container 301 in a plan view.

Other Example 2 of Vaporization Device

Figure 8:
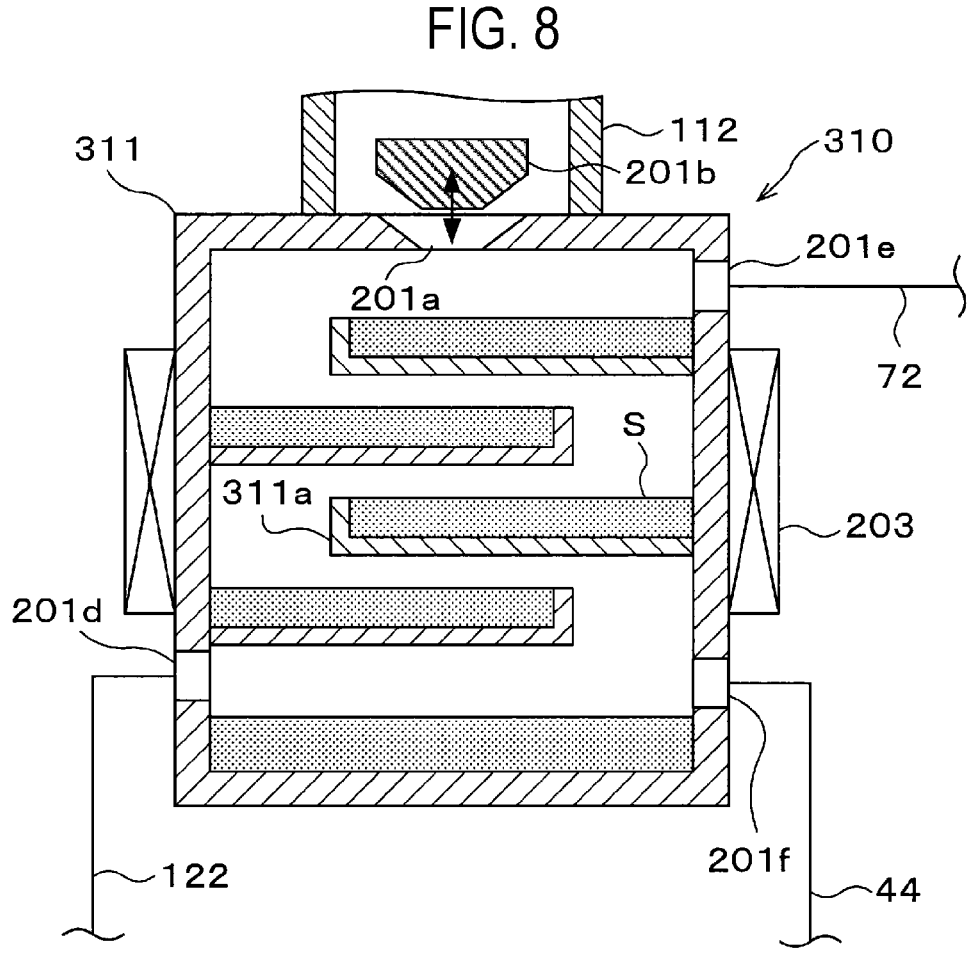
FIG. 8 is a diagram showing another example of the vaporization device.

FIG. 8 is a diagram showing another example of the vaporization device. In the vaporization devices 10 (10A and 10B) and 300 of the above examples, the filter 202 or 302 is provided in the container 201 or 301 to separate the solid raw material R in the suspension. On the other hand, a vaporization device 310 shown in FIG. 8 is not provided with a filter. In the vaporization device 310, a container 311 is used as a storage for temporarily storing a dispersion (suspension in the present embodiment) in which a solid raw material is dispersed. In this example, the separation mechanism for separating the solid raw material vaporizes (evaporates) only the dispersion medium in the suspension temporarily stored in the container 311 and separates the solid raw material R from the suspension. The evaporation of the dispersion medium L in the suspension is performed by, for example, the depressurization by the depressurization mechanism 40 (see FIG. 1), the heating by the heating mechanism 203, or a combination thereof.

The vaporization device 310 includes a plurality of shelves 311*a* provide in the container 311 to accommodate a suspension S. When the dispersion medium of the suspension S contained in the shelves 311*a* evaporates, the solid raw material remains in the shelves 311*a*. The shelves 311*a* are stacked in the vertical direction. Further, the shelves 311*a* adjacent to each other in the vertical direction are provided to overhang in different directions. More specifically, each of the shelves 311*a* has a shape in which an edge of a circle is cut out in a plan view. In the shelves 311*a* adjacent to each other in the vertical direction, the cutout portions as described above face each other across a center of the container 311 in a plan view.

Since the shelves 311*a* are provided as described above, a carrier gas flow path having a labyrinth structure is formed in the container 311. According to the vaporization device 310, since the flow path of the carrier gas having the labyrinth structure is long, a high pickup amount can be obtained. Further, since the shelves 311*a* are provided as described above, the suspension S supplied from the replenishment port 201*a* can be sequentially supplied to all the shelves 311*a* from above.

In this example, the carrier gas introduction port 201*d* is provided at a position, which is between the lowermost shelf 311*a* and a bottom wall of the container and on a side wall of the container on a side of a root portion of the lowermost shelf 311*a*, and the gas supply port 201*e* is provided at a position, which is between the uppermost shelf 311*a* and a top wall of the container and on a side wall of the container on a side of a root portion of the uppermost shelf 311*a*.

Other Example 3 of Vaporization Device

Figure 9:
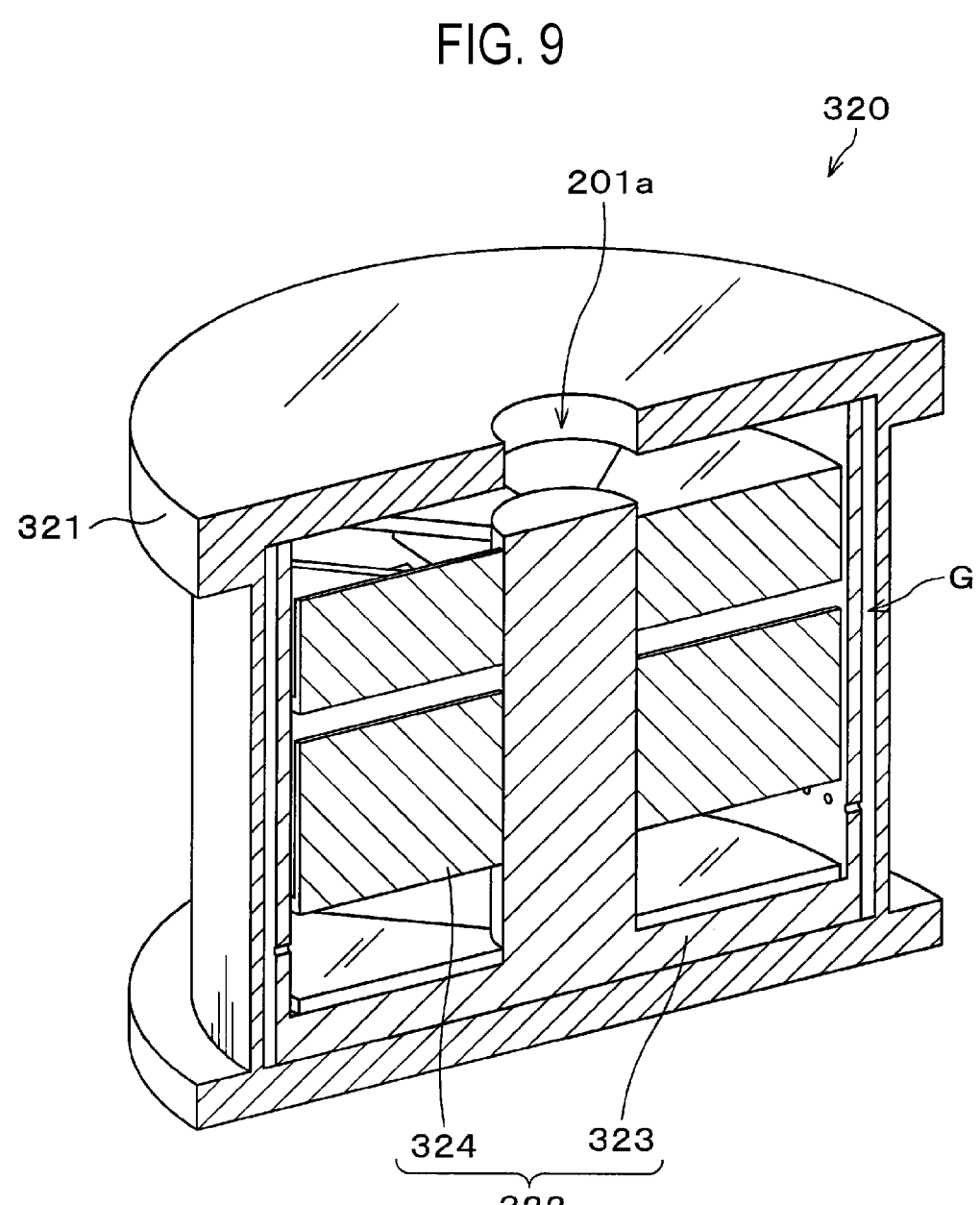
FIG. 9 is a partially-cutout perspective view showing another example of the vaporization device.
Figure 10:
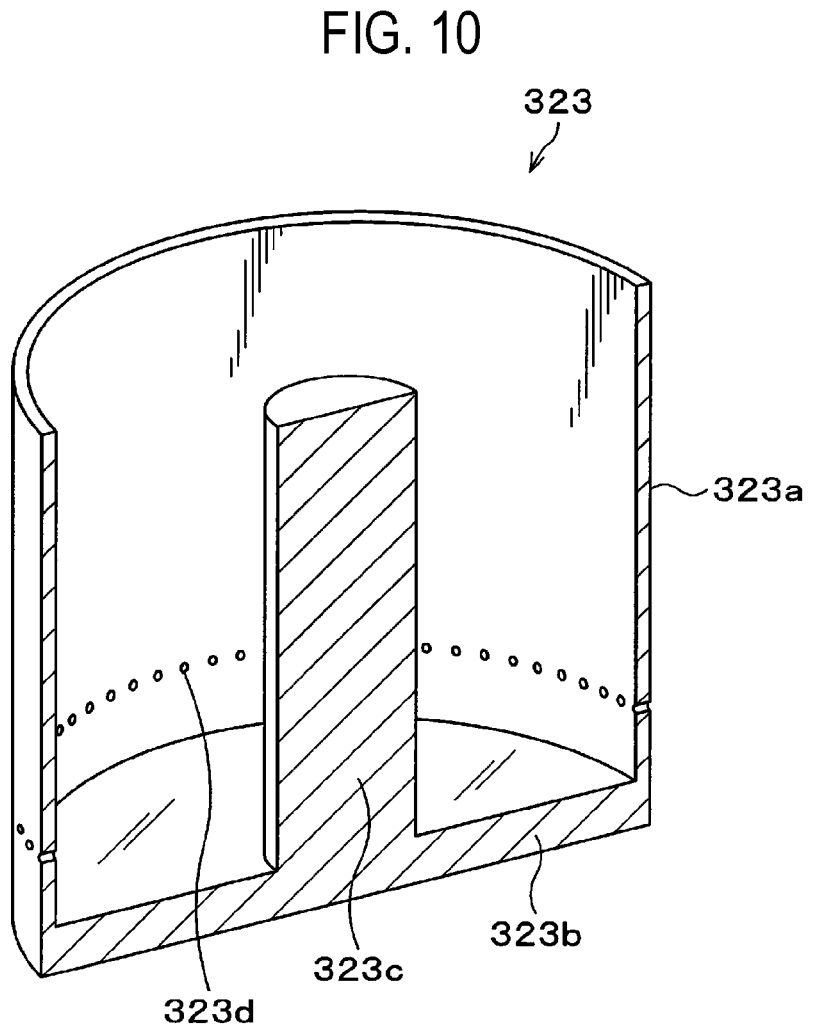
FIG. 10 is a perspective view showing a first member of a tray assembly of the vaporization device shown in FIG. 9.
Figure 11:
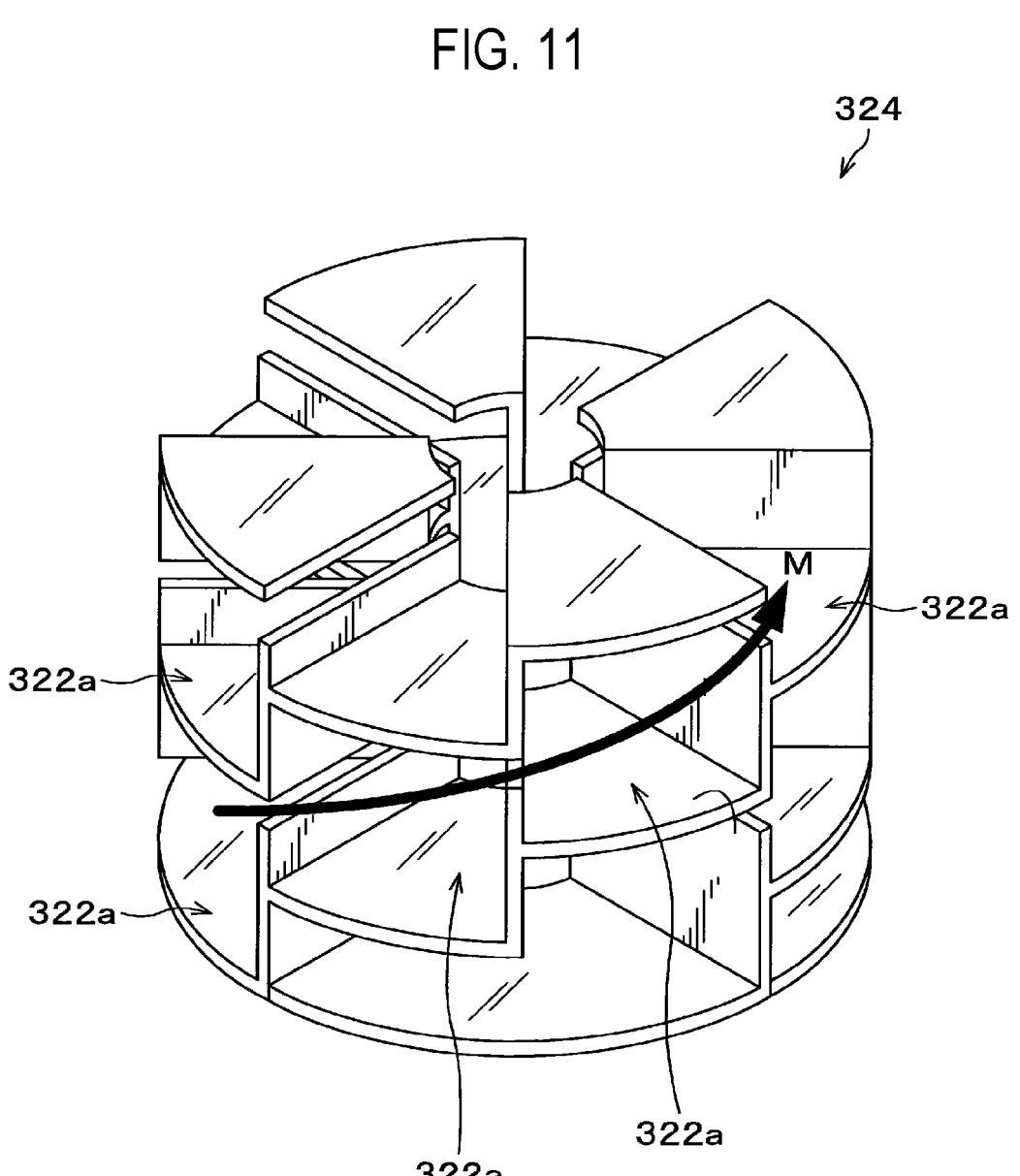
FIG. 11 is a perspective view showing a second member of the tray assembly of the vaporization device shown in FIG. 9.

FIGS. 9 to 11 are diagrams showing another example of the vaporization device. FIG. 9 is a partially cutout perspective view showing the vaporization device of this example, and FIGS. 10 and 11 are perspective views showing a first member and a second member of a tray assembly described later, respectively. Just like the vaporization device 310 shown in FIG. 7, a vaporization device 320 of the example shown in FIGS. 9 to 11 is not provided with a filter for separating the solid raw material R in the suspension and includes a plurality of shelves in the container. However, in the vaporization device 320, a flow path of the carrier gas is formed in a spiral shape, and the shelves are provided along this flow path. Hereinafter, a specific description will be given.

The vaporization device 320 includes a tray assembly 322 in a container 321 as shown in FIG. 9. The container 321 has the same configuration as the container 311 shown in FIG. 8 and is provided with a replenishment port 201a and the like. Although not shown, the container 321 is also provided with the carrier gas introduction port 201d, the gas supply port 201e, and the exhaust port 201f. The tray assembly 322 includes a first member 323 and a second member 324.

As shown in FIG. 10, the first member 323 has a cylindrical side wall 323a, a disk-shaped bottom wall 323b, and a cylindrical columnar portion 323c extending upward from the bottom wall 323b. As shown in FIG. 9, a gap G is provided between the side wall 323a and an inner peripheral surface of the side wall of the container 321. Further, as shown in FIG. 10, a plurality of through-holes 323d arranged at equal intervals along a circumferential direction is formed on the side wall 323a. The through-holes 323d are provided at a position corresponding to a shelf provided at the lowermost position among a plurality of shelves described later so that a carrier gas can be supplied to the lowermost shelf.

The second member 324 of the tray assembly 322 is arranged between the side wall 323a of the first member 323 and the columnar portion 323c at a position on the bottom wall 323b of the first member 323. The second member 324 and the first member 323 form the following (a) and (b).

(a) A spiral carrier gas flow path around a central axis of the container 321 as indicated by an arrow M.

(b) A plurality of shelves 322a arranged along the carrier gas flow path and configured to contain a suspension.

In the example shown in the figure, four carrier gas flow paths are formed.

The carrier gas supplied into the container 321 through the carrier gas introduction port 201d (see FIG. 8) flows into the lowermost shelf 322a through the gap G and the through-holes 323d, flows along the carrier gas flow path and reaches the inside of the uppermost shelf 322a. Since an upper side of the uppermost shelf 322a is opened in the container 321, the carrier gas reaching the uppermost shelf 322a is discharged from the gas supply port 201e (see FIG. 8) together with the raw material gas.

According to the vaporization device 320, the carrier gas flow path is formed long in a spiral shape so that a high pickup amount can be obtained. Further, since the shelves 322a are provided as described above, the suspension supplied from the replenishment port 201a can be sequentially supplied to all the shelves 322a from above.

As described above, the vaporization device 310 or 320 is not provided with a filter for separating the solid raw material R in the suspension. Therefore, in the vaporization device 310 or 320, the container 311 or 321 does not have a drainage port for discharging the dispersion medium of the suspension that has passed through the filter to the outside of the container 311 or 321. Therefore, when the vaporization device 310 or 320 is used, the discharge pipes 130 and 131 (see FIG. 1) are omitted.

Second Embodiment

Figure 12:
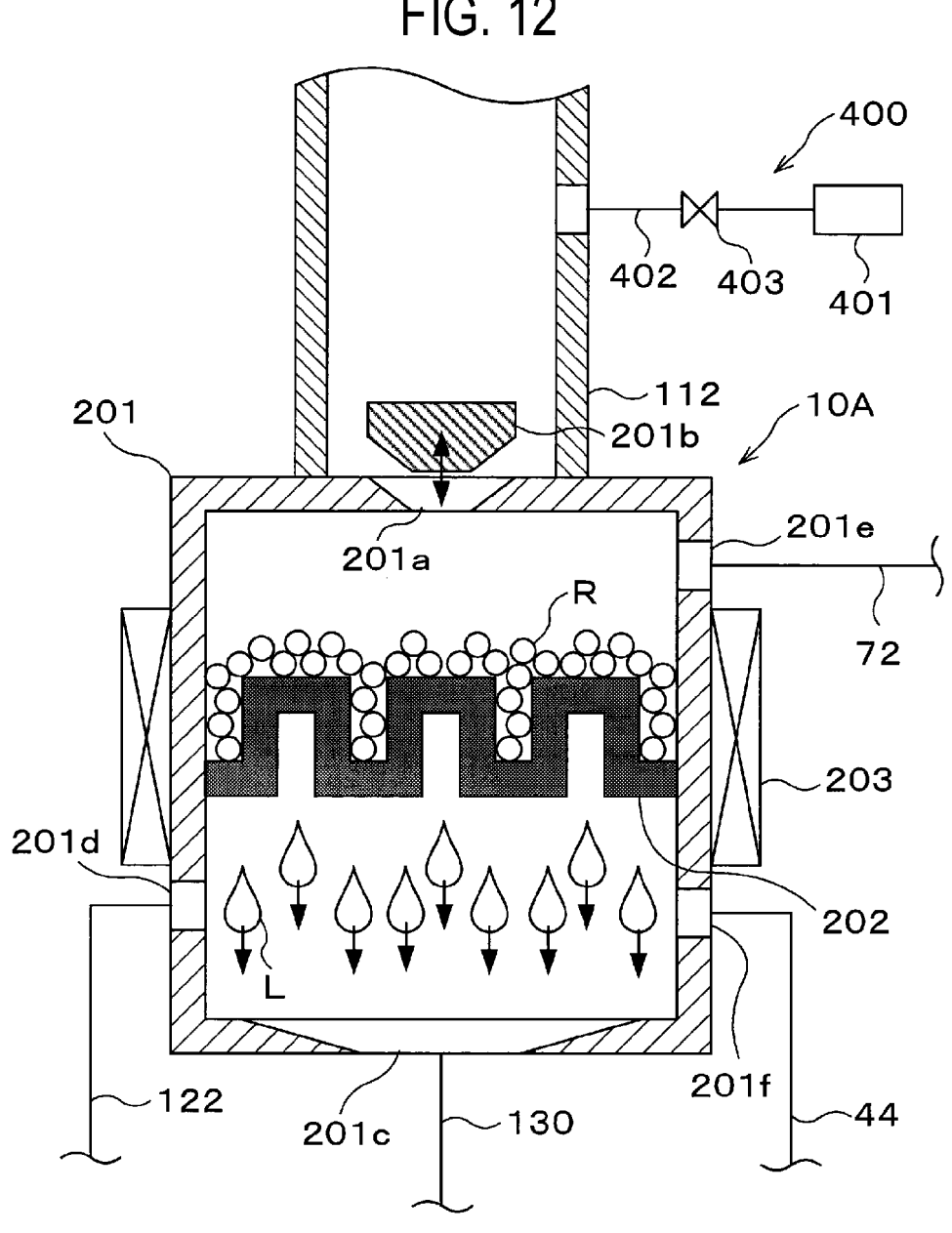
FIG. 12 is a diagram schematically showing a part of a raw material gas supply system according to a second embodiment.

FIG. 12 is a diagram schematically showing a part of a raw material gas supply system according to a second embodiment. The raw material gas supply system according to the present embodiment includes a cleaning mechanism 400 that supplies a fluid to the sealing surface between the replenishment valve 201b and the replenishment port 201a to clean the sealing surface. The fluid is, for example, the same liquid as the dispersion medium of the suspension.

The cleaning mechanism 400 includes a fluid source 401 and a cleaning fluid supply pipe 402. The fluid source 401 stores a fluid (hereinafter referred to as "cleaning fluid") for cleaning the sealing surface between the replenishment valve 201b and the replenishment port 201a, and supplies the stored fluid to the sealing surface. The cleaning fluid supply pipe 402 connects the fluid source 401 and the branch pipe 112 of the replenishment pipe 110. The cleaning fluid supply pipe 402 is provided with an on-off valve 403.

For the cleaning with the cleaning fluid, for example, the replenishment valve 201b and the on-off valve 52 of the replenishment branch pipe 112 are opened and the suspension is supplied to the vaporization device 10A. Thereafter, first, while the replenishment valve 201b is kept open, the on-off valve 52 is closed to stop the supply of the suspension. Thereafter, the on-off valve 403 of the cleaning fluid supply pipe 402 is opened. As a result, the cleaning fluid that has passed through the cleaning fluid supply pipe 402 and the branch pipe 112 is supplied to the sealing surface between the replenishment valve 201b and the replenishment port 201a, whereby the sealing surface can be cleaned.

Further, for example, after the cleaning fluid is once supplied, the cleaning fluid may be stored in the branch pipe 112 by closing the replenishment valve 201b, and then the replenishment valve 201b may be opened to allow a large amount of cleaning fluid to flow to the sealing surface between the replenishment valve 201b and the replenishment port 201a at once. As a result, a flow rate of the cleaning fluid supplied to the sealing surface increases so that cleanliness of the sealing surface can be improved. The step of storing the cleaning fluid and then allowing the cleaning fluid to flow at once may be performed a plurality of times.

By cleaning the sealing surface between the replenishment valve 201b and the replenishment port 201a as described above, it is possible to prevent the solid raw material in the suspension from adhering to the sealing surface and impairing airtightness. In the above description, the cleaning fluid is a liquid. However, the cleaning fluid may be a gas. When a gas is used as the cleaning fluid, the cleaning can be performed by, for example, spraying the gas onto the sealing surface.

Third Embodiment

Figure 13:
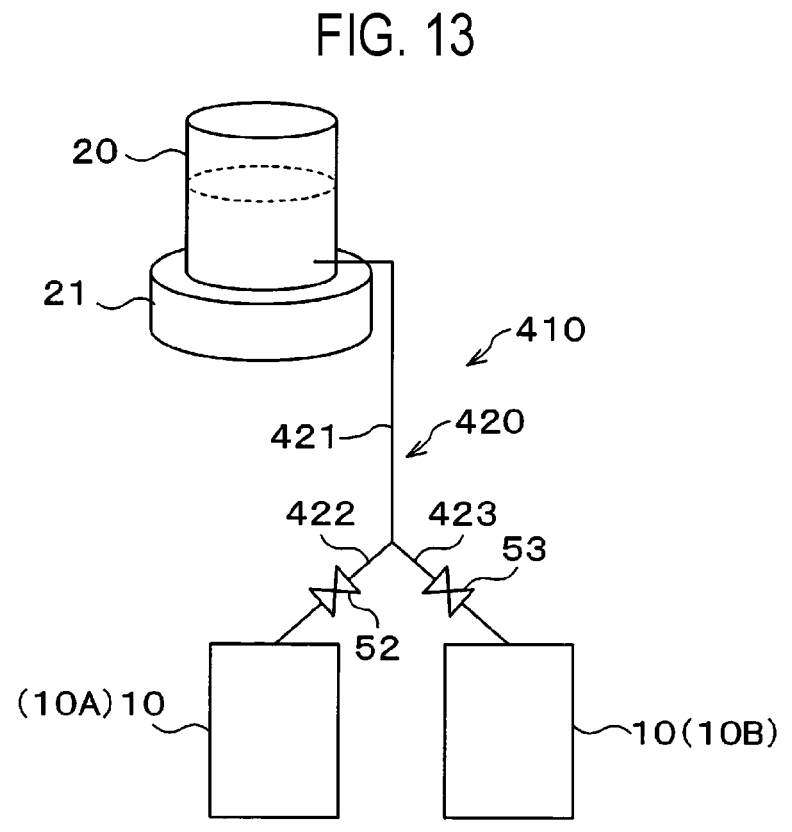

FIG. 13 is a diagram schematically showing a part of a raw material gas supply system according to a third embodiment. In the above-described embodiments, the suspension is delivered from the storage container 20 to the vaporization devices 10 (10A and 10B) by pumping. On the other hand, in the raw material gas supply system according to the present embodiment, a delivery mechanism 410 that delivers the suspension from the storage container 20 to the vaporization devices 10 (10A and 10B) is configured to deliver the suspension using the gravity acting on the suspension. Hereinafter, a specific description will be given.

In the present embodiment, the storage container 20 is located above the vaporization devices 10 (10A and 10B). The delivery mechanism 410 includes a replenishment pipe 420 that connects the vaporization devices 10 (10A and 10B) and the storage container 20 located above the vaporization devices 10 (10A and 10B). The replenishment pipe 420 includes a replenishment common pipe 421 having an upstream end connected to the storage container 20, and replenishment branch pipes 422 and 423 branching from a downstream end of the common pipe 421. A downstream end of the branch pipe 422 is connected to the vaporization device 10A, and a downstream end of the branch pipe 423 is connected to the vaporization device 10B. The branch pipes 422 and 423 are provided with on-off valves 52 and 53, respectively.

The common pipe 421 is a straight pipe and is provided to extend in the vertical direction. Thus, the suspension in the storage container 20 is smoothly delivered to the downstream end of the common pipe 421, which branches to the branch pipes 442 and 423, by the gravity acting on the suspension. Further, the branch pipes 422 and 423 are straight pipes, respectively, and are provided to be inclined with respect to vertical and horizontal planes, i.e., to extend in an oblique direction. As a result, the suspension reaching an upstream end of the branch pipes 422 and 423 is smoothly fed to the vaporization devices 10 (10A and 10B) along the branch pipes 422 and 123 by gravity.

<Modification of Carrier Gas Introduction Method and Exhaust Method>

In the above examples, the carrier gas is introduced into the container to flow from the bottom to the top in the container of the vaporization device. Alternatively, the carrier gas may be introduced so as to flow from the top to the bottom.

Further, in the above examples, the carrier gas introduction port 201d, the gas supply port 201e, and the exhaust port 201f are provided independently of the replenishment port 201a and the drainage port 201c. Alternatively, the carrier gas introduction port 201d, the gas supply port 201e, the exhaust port 201f, the replenishment port 201a, and the drainage port 201c may be made common.

For example, when the carrier gas introduction port 201d, the gas supply port 201e, the exhaust port 201f, and the replenishment port 201a are made common, the following method may be used. That is, the carrier gas branch pipes 122 and 123, the raw material gas branch pipes 72 and 73, and the exhaust branch pipes 44 and 45 may be connected to the replenishment branch pipes 112 and 113, respectively. Similarly, when the carrier gas introduction port 201d, the gas supply port 201e, the exhaust port 201f, and the drainage port 201c are made common, the following method may be used. That is, the carrier gas branch pipes 122 and 123, the raw material gas branch pipes 72 and 73, and the exhaust branch pipes 44 and 45 may be connected to the discharge pipes 130 and 131, respectively.

Fourth Embodiment

Figure 14:
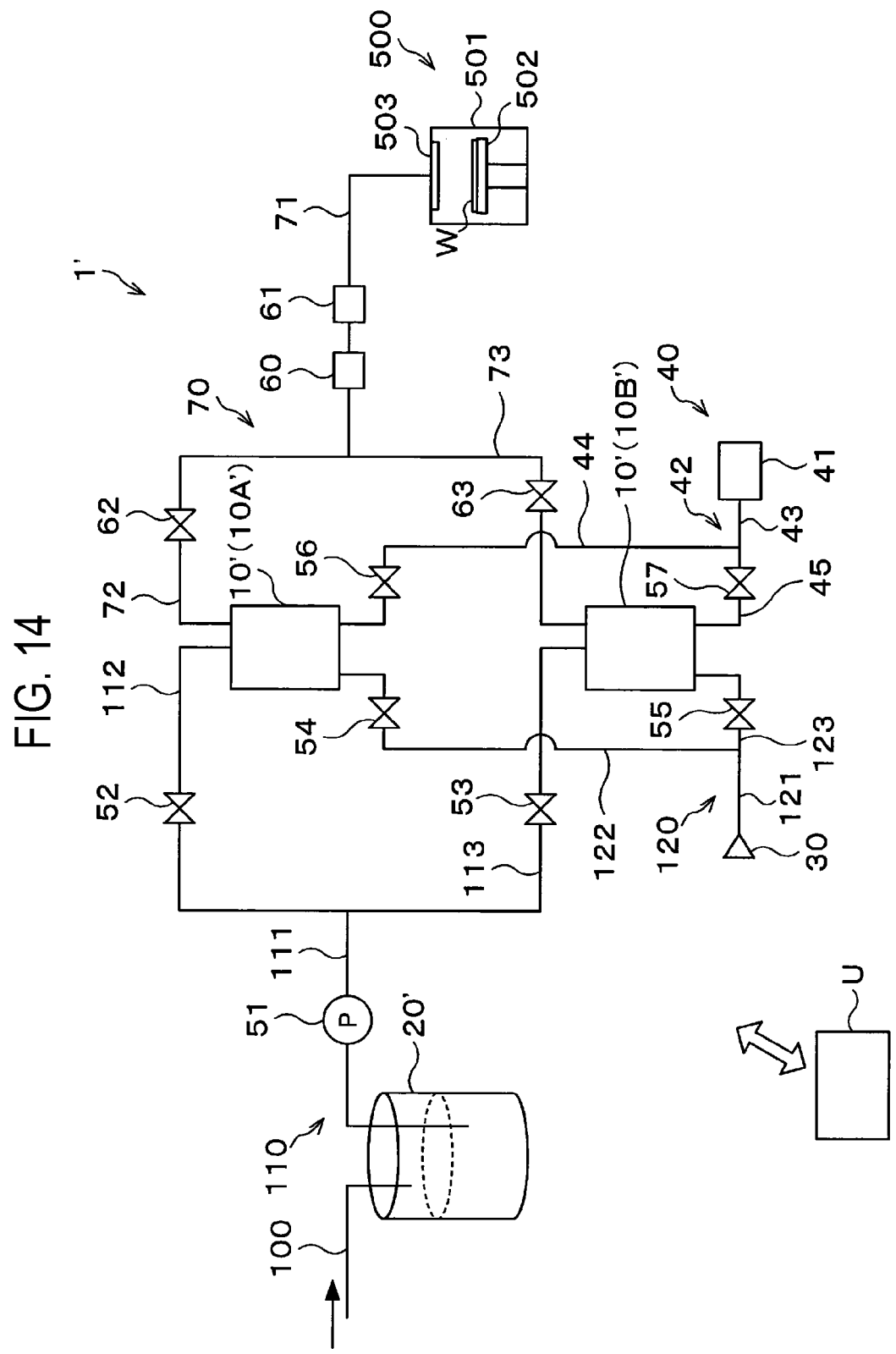
FIG. 14 is a system configuration diagram schematically showing an outline of a configuration of a raw material gas supply system according to a fourth embodiment.

FIG. 14 is a system configuration diagram schematically showing an outline of a configuration of a raw material gas supply system according to a fourth embodiment. In the above-described embodiments, when the solid raw material is replenished to the vaporization devices 10 (10A and 10B), the suspension containing the solid raw material as a dispersoid is supplied to the vaporization devices 10 (10A and 10B). On the other hand, in the raw material gas supply system 1' shown in FIG. 14, when the solid raw material is replenished to vaporization devices 10' (10A' and 10B), a sol made of the solid raw material as a dispersoid is supplied to the vaporization devices 10' (10A' and 10B').

"Sol" is synonymous with a colloid solution and refers to dispersions in which solid particles are dispersed in a liquid, particularly, a dispersion in which a particle size of solid particles as a dispersoid is small and the solid particles are not precipitated even when the dispersion is left as it is. "Sol" is one of the subordinate concepts of colloid. Colloid is one of the subordinate concepts of a dispersion.

In the raw material gas supply system 1', the solid raw material is separated from the sol (hereinafter sometimes referred to as "raw material sol") containing the solid raw material as a dispersoid in the vaporization devices 10' (10A' and 10B'). Then, the vaporization devices 10' (10A' and 10B') vaporizes the solid raw material to generate a raw material gas.

In the raw material sol, the solid raw material does not precipitate even when left as it is. Therefore, as shown in FIG. 14, the stirring stage 21 (see FIG. 1) may be omitted.

The raw material sol is stored in a storage container 20'. As the solid raw material in the raw material sol, for example, one having a particle size of 1 mm or less is used. Further, as a dispersion medium of the raw material sol, for example, the same one as the suspension is used.

The raw material sol is pushed out from the storage container 20' by a pressurizing gas introduced into the storage container 20' through the pressurizing gas supply pipe 100 and is supplied to the replenishment pipe 110. The raw material sol supplied to the replenishment pipe 110 is delivered to the vaporization devices 10' (10A' and 10B') by, for example, the pump 51.

When a dispersoid concentration, i.e., a concentration of the solid raw material in the raw material sol is high and a viscosity of the raw material sol is high, the vaporization devices 10' (10A' and 10B') used may be, for example, vaporization devices having a barrel-shaped container in which the shelves 311a are omitted from the vaporization device 310 shown in FIG. 8. When such vaporization devices 10' (10A' and 10B') are used, the discharge pipes 130 and 131 (see FIG. 1) are omitted in the raw material gas supply system 1'. When the solid raw material is produced by the vaporization devices 10' (10A' and 10B), only the dispersion medium of the raw material sol temporarily stored in the containers of the vaporization devices 10' (10A' and 10B') is evaporated to separate the solid raw material from the raw material sol. The evaporation of the dispersion medium is performed by, for example, the depressurization by the depressurization mechanism 40, the heating by the heating mechanism for heating the container, or a combination thereof.

Further, when the vaporization devices having a barrel-shaped container are used as the vaporization devices 10' (10A' and 10B), the positions of the carrier gas introduction port and the exhaust port are appropriately adjusted.

When the concentration of the solid raw material in the raw material sol is low and the viscosity of the raw material sol is low, the vaporization devices 10' (10A' and 10B') used may be the same as those shown in FIGS. 2 and 7 to 11.

Further, when the raw material sol is used, the cleaning mechanism 400 may be provided as in the second embodiment. Further, when the raw material sol is used, the raw material sol may be delivered to the vaporization devices 10' (10A' and 10B') by gravity acting on the raw material sol as in the third embodiment.

Even when the raw material sol is used as in the present embodiment, when the solid raw material is replenished to the vaporization devices 10' (10A' and 10B), as in the first embodiment, it is not necessary to perform a work in the vicinity of the film-forming apparatus 500 when replenishing the solid raw material to the vaporization devices 10' (10A' and 10B'). Therefore, the solid raw material can be replenished to the vaporization devices 10' (10A' and 10B') in a form that does not adversely affect the film-forming process performed in the film-forming apparatus 500.

Further, in the present embodiment, as in the first embodiment, the storage container 20' to be replaced does not serve as a vaporization device and the degree of freedom of installation location of the storage container 20' is high. Therefore, the storage container 20' can be installed at a position that facilitates the replacement work thereof.

Further, in the present embodiment, as in the first embodiment, it is possible to adopt a configuration in which the solid raw material is alternately replenished to two vaporization devices 10' (10A' and 10B'). Therefore, even when the solid raw material that requires a long time for heating is used, it is possible to prevent the throughput of the film-forming process from being lowered due to the waiting time until the solid raw material is heated to a desired temperature.

Further, in the present embodiment, as in the first embodiment, the solid raw material is not in the state of a liquid raw material dissolved in a solvent. Therefore, it is possible to form a high-quality film.

Further, in the present embodiment, as in the first embodiment, the type of the dispersion medium is not limited.

Further, in the present embodiment, the concentration of the raw material in the replenished dispersion can be increased as compared with the case where the suspension of the raw material gas is used as in the first embodiment. The reason is that the solid raw material does not precipitate. Therefore, the solid raw material can be replenished to the vaporization devices more efficiently.

OTHER APPLICATIONS

It should be noted that the embodiments disclosed herein are exemplary in all respects and not limitative. The above-described embodiments may be omitted, replaced, or modified in various forms without departing from the scope of the appended claims and their gist.

The following configurations also belong to the technical scope of the present disclosure.

(1) A raw material gas supply system for supplying a raw material gas generated by vaporizing a solid raw material to a processing apparatus, the raw material gas supply system including:

a vaporization device configured to vaporize the solid raw material to generate the raw material gas;

a delivery mechanism configured to deliver a dispersion containing the solid raw material dispersed in a liquid from a storage container storing the dispersion to the vaporization device; and a separation mechanism configured to separate the solid raw material from the dispersion in the vaporization device.

According to (1), the solid raw material can be replenished to the raw material gas supply system in a form that does not adversely affect the processing in the processing apparatus.

(2) The raw material gas supply system of (1), wherein the separation mechanism includes a filter having a plurality of holes that are each smaller than a size of the solid raw material and provided in the vaporization device.

(3) The raw material gas supply system of (2), wherein the filter is formed to have a waveform in a sectional view.

(4) The raw material gas supply system of (2) or (3), wherein the vaporization device includes a housing having a dispersion replenishment port formed above the filter,

wherein the filter is provided along an inner peripheral surface of a side wall of the housing of the vaporization device, and wherein the filter has an upper surface which is an inclined surface extending downward and radially outward.

According to (4), the solid raw material can be efficiently vaporized.

(5) The raw material gas supply system of (4), further including a heating mechanism configured to heat the side wall of the housing.

(6) The raw material gas supply system of any one of (2) to (5), wherein the housing of the vaporization device has a carrier gas introduction port leading to a carrier gas source and a gas supply port leading to the processing apparatus, wherein the carrier gas introduction port is provided on one side of the housing with the filter sandwiched therebetween, and wherein the gas supply port is provided on the other side of the housing.

According to (6), a high pickup amount can be surely obtained.

(7) The raw material gas supply system of any one of (1) to (6), further including:

a replenishment valve configured to open and close the dispersion replenishment port of the vaporization device; and a cleaning mechanism configured to supply a fluid to a sealing surface of the replenishment valve to clean the sealing surface.

According to (7), it is possible to prevent the airtightness of the vaporization device from being impaired.

(8) The raw material gas supply system of any one of (1) to (7), wherein the vaporization device is further configured to temporarily store the dispersion, and wherein the separation mechanism is further configured to separate the solid raw material by evaporating a dispersion medium of the dispersion temporarily stored in the vaporization device.

(9) The raw material gas supply system of (8), wherein the vaporization device includes a plurality of shelves configured to accommodate the dispersion.

(10) The raw material gas supply system of (9), wherein the shelves are stacked in a vertical direction.

(11) The raw material gas supply system of (10), wherein the shelves adjacent to each other in the vertical direction are formed to overhang in different directions.

According to (11), the carrier gas flow path can be lengthened and the pickup amount can be increased.

(12) The raw material gas supply system of (10), wherein a carrier gas flow path is formed in a spiral shape, and wherein the shelves are arranged along the carrier gas flow path.

According to (12), the carrier gas flow path can be lengthened and the pickup amount can be increased.

(13) The raw material gas supply system of any one of (1) to (12), wherein the delivery mechanism is further configured to pump the dispersion from the storage container to the vaporization device.

(14) The raw material gas supply system of any one of (1) to (13), wherein the delivery mechanism is further configured to deliver the dispersion by gravity acting on the dispersion.

(15) The raw material gas supply system of any one of (1) to (14), further comprising:

a plurality of vaporization devices connected in parallel with one another; and a control device configured to output a control signal so that when one part of the plurality of vaporization devices is in a state capable of supplying the raw material gas to the processing apparatus, the dispersion is delivered from the storage container to the other part of the vaporization devices and the solid raw material is separated from the dispersion in the other part of the vaporization devices.

According to (15), the raw material gas can be continuously supplied even when the solid raw material is replenished.

(16) The raw material gas supply system of any one of (1) to (15), wherein the dispersion is a suspension containing the solid raw material as a dispersoid.

(17) The raw material gas supply system of (16), further including stirring device configured to stir the suspension in the storage container.

According to (17), the ratio of the solid raw material in the suspension supplied to the vaporization device can be made uniform.

(18) The raw material gas supply system of any one of (1) to (15), wherein the dispersion is a sol containing the solid raw material as a dispersoid.

(19) A raw material gas supply method of supplying a raw material gas generated by vaporizing a solid raw material to a processing apparatus, the raw material gas supply method including:

delivering a dispersion containing the solid raw material dispersed in a liquid from a storage container storing the dispersion to a vaporization device;

separating the solid raw material from the dispersion in the vaporization device;

generating the raw material gas by vaporizing the separated solid raw material in the vaporization device; and supplying the generated raw material gas to the processing apparatus.

EXPLANATION OF REFERENCE NUMERALS 1, 1': raw material gas supply system, 10A, 10B, 10A', 10B', 300, 310, 320: vaporization device, 20: storage container, 40: depressurization mechanism, 51: pump, 100: pressurizing gas supply pipe, 203: heating mechanism, 420: replenishment pipe, 500: film-forming apparatus, R: solid raw material, S: suspension

What is claimed is:

1. A raw material gas supply system for supplying a raw material gas to a processing apparatus, the raw material gas supply system comprising:

a storage container storing a dispersion that contains a solid raw material dispersed in a liquid;

a first vaporization device configured to separate the solid raw material from the dispersion by a first filter provided in the first vaporization device to deposit the solid raw material on the first filter, and configured to vaporize the solid raw material deposited on the first filter to generate the raw material gas;

a second vaporization device connected in parallel with the first vaporization device, configured to separate the solid raw material from the dispersion by a second filter provided in the second vaporization device to deposit the solid raw material on the second filter, and configured to vaporize the solid raw material deposited on the second filter to generate the raw material gas;

a delivery mechanism configured to deliver the dispersion from the storage container to the first vaporization device and the second vaporization device; and a control device programmed to control the first vaporization device, the second vaporization device, and the delivery mechanism to alternately execute:

supplying the raw material gas from the first vaporization device to the processing apparatus by vaporizing the solid raw material deposited on the first filter to generate the raw material gas, while replenishing the solid raw material to the second vaporization device by supplying the dispersion to the second vaporization device to deposit the solid raw material on the second filter; and supplying the raw material gas from the second vaporization device to the processing apparatus by vaporizing the solid raw material deposited on the second filter to generate the raw material gas, while replenishing the solid raw material to the first vaporization device by supplying the dispersion to the first vaporization device to deposit the solid raw material on the first filter, wherein the first filter and the second filter are formed to have a waveform in a sectional view.

2. The raw material gas supply system of claim 1, wherein the first vaporization device includes a first housing having a first dispersion replenishment port formed above the first filter, wherein the first filter is provided along an inner peripheral surface of a side wall of the first housing of the first vaporization device, wherein the first filter has an upper surface which is an inclined surface extending downward and radially outward, wherein the second vaporization device includes a second housing having a second dispersion replenishment port formed above the second filter, wherein the second filter is provided along an inner peripheral surface of a side wall of the second housing of the second vaporization device, and wherein the second filter has an upper surface which is an inclined surface extending downward and radially outward.

3. The raw material gas supply system of claim 2, further comprising:

a first heater configured to heat the side wall of the first housing; and a second heater configured to heat the side wall of the second housing.

4. The raw material gas supply system of claim 1, wherein a first housing of the first vaporization device has a first carrier gas introduction port leading to a carrier gas source and a first gas supply port leading to the processing apparatus, wherein the first carrier gas introduction port is provided on one side of the first housing with the first filter sandwiched therebetween, wherein the first gas supply port is provided on the other side of the first housing, wherein a second housing of the second vaporization device has a second carrier gas introduction port leading to the carrier gas source and a second gas supply port leading to the processing apparatus, wherein the second carrier gas introduction port is provided on one side of the second housing with the second filter sandwiched therebetween, and wherein the second gas supply port is provided on the other side of the second housing.

5. The raw material gas supply system of claim 1, further comprising:

a first replenishment valve configured to open and close a first dispersion replenishment port of the first vaporization device;

a second replenishment valve configured to open and close a second dispersion replenishment port of the second vaporization device; and a cleaner configured to supply a fluid to a first sealing surface of the first replenishment valve to clean the first sealing surface, and configured to supply the fluid to a second sealing surface of the second replenishment valve to clean the second sealing surface.

6. The raw material gas supply system of claim 1, wherein the delivery mechanism is further configured to pump the dispersion from the storage container to the first vaporization device, and to pump the dispersion from the storage container to the second vaporization device.

7. The raw material gas supply system of claim 1, wherein the delivery mechanism is further configured to deliver the dispersion by gravity acting on the dispersion.

8. The raw material gas supply system of claim 1, wherein the dispersion is a suspension containing the solid raw material as a dispersoid.

9. The raw material gas supply system of claim 8, further comprising a stirring device configured to stir the suspension in the storage container.

10. The raw material gas supply system of claim 1, wherein the dispersion is a sol containing the solid raw material as a dispersoid.

11. A raw material gas supply method of supplying a raw material gas to a processing apparatus, the raw material gas supply method comprising:

storing, in a storage container, a dispersion that contains a solid raw material dispersed in a liquid;

delivering the dispersion from the storage container to a vaporization device; and supplying the raw material gas from the vaporization device to the processing apparatus, wherein the vaporization device includes:

a first vaporization device having a first filter configured to separate the solid raw material from the dispersion and deposit the solid raw material on the first filter; and a second vaporization device connected in parallel with the first vaporization device, and having a second filter configured to separate the solid raw material from the dispersion and deposit the solid raw material on the second filter, and wherein the supplying the raw material gas includes alternately executing:

supplying the raw material gas from the first vaporization device to the processing apparatus by vaporizing the solid raw material deposited on the first filter to generate the raw material gas, while replenishing the solid raw material to the second vaporization device by supplying the dispersion to the second vaporization device to deposit the solid raw material on the second filter; and supplying the raw material gas from the second vaporization device to the processing apparatus by vaporizing the solid raw material deposited on the second filter to generate the raw material gas, while replenishing the solid raw material to the first vaporization device by supplying the dispersion to the first vaporization device to deposit the solid raw material on the first filter, and wherein the first filter and the second filter are formed to have a waveform in a sectional view.

* * * * *